(12) United States Patent
Yamazaki et al.

(10) Patent No.: US 12,720,915 B2
(45) Date of Patent: Aug. 25, 2026

(54) DISPLAY APPARATUS AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Koji Kusunoki, Isehara (JP); Naoto Kusumoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 790 days.

(21) Appl. No.: 17/760,204

(22) PCT Filed: Feb. 1, 2021

(86) PCT No.: PCT/IB2021/050762
§ 371 (c)(1),
(2) Date: Aug. 5, 2022

(87) PCT Pub. No.: WO2021/161126
PCT Pub. Date: Aug. 19, 2021

(65) Prior Publication Data

US 2023/0060303 A1 Mar. 2, 2023

(30) Foreign Application Priority Data

Feb. 14, 2020 (JP) ................................. 2020-023149

(51) Int. Cl.
*H10H 20/814* (2025.01)
*H10H 20/851* (2025.01)
(Continued)

(52) U.S. Cl.
CPC ...... *H10H 20/814* (2025.01); *H10H 20/8512* (2025.01); *H10H 20/857* (2025.01); *H10W 90/00* (2026.01)

(58) Field of Classification Search
CPC ... H01L 33/10; H01L 25/0753; H01L 33/502; H01L 33/62; H01L 21/6835;
(Continued)

(56) References Cited

U.S. PATENT DOCUMENTS 6,911,772 B2 * 6/2005 Cok .................. H10K 59/8792 313/506
7,656,085 B2 * 2/2010 Li ........................ H10K 59/128 313/506
(Continued)

FOREIGN PATENT DOCUMENTS

CN 111223888 A 6/2020
EP 3657542 A 5/2020
(Continued)

OTHER PUBLICATIONS

Taiwanese Office Action (Application No. 110102547) Dated Sep. 12, 2024.

(Continued)

*Primary Examiner* — Vu A Vu
(74) *Attorney, Agent, or Firm* — Fish & Richardson P.C.

(57) ABSTRACT

A highly reliable display apparatus is provided at a low cost. The display apparatus includes a light-emitting diode included in a pixel circuit, a transistor included in the pixel circuit, and a transistor included in a driver circuit of the pixel circuit, which are stacked to have an overlap region. With such a structure, the display apparatus can be downsized. In addition, in the display apparatus, a plurality of light-emitting diodes can be attached to a circuit board formed with a transistor and the like in one step. Consequently, the manufacturing cost of the display apparatus can be reduced.

11 Claims, 19 Drawing Sheets

(51) Int. Cl.
*H10H 20/857* (2025.01)
*H10W 90/00* (2026.01)

(58) Field of Classification Search
CPC ............. H01L 27/1225; H01L 21/7806; H01L 27/0688; H01L 27/1207; H01L 29/7869; H01L 25/167; H01L 33/60; H01L 27/088; H01L 33/507; H01L 2221/68345; H01L 2221/6835; H01L 2221/68359; H01L 2221/68368; H01L 27/156; H01L 27/124; H01L 27/1248; H01L 33/30
USPC ............................................................ 257/79
See application file for complete search history.

(56) References Cited

U.S. PATENT DOCUMENTS

| | | | | |
|---|---|---|---|---|
| 7,901,088 | B2 | 3/2011 | Nakamura et al. | |
| 9,153,635 | B2 * | 10/2015 | Tateishi | H10D 62/80 |
| 10,342,124 | B2 * | 7/2019 | Jikumaru | H10K 50/865 |
| 10,373,983 | B2 | 8/2019 | Takahashi et al. | |
| 10,700,098 | B2 | 6/2020 | Takahashi et al. | |
| 10,707,377 | B2 * | 7/2020 | Kim | H10H 20/832 |
| 10,937,774 | B2 * | 3/2021 | Fu | H01L 25/167 |
| 11,094,867 | B2 | 8/2021 | Kang | |
| 11,217,156 | B2 * | 1/2022 | He | H10K 50/844 |
| 11,342,396 | B2 * | 5/2022 | Wang | H10K 59/124 |
| 11,404,447 | B2 | 8/2022 | Takahashi et al. | |
| 11,676,971 | B2 | 6/2023 | Takahashi et al. | |
| 11,688,825 | B2 * | 6/2023 | Huang | H01L 33/12 428/141 |
| 11,728,163 | B2 | 8/2023 | Tanemura. et al. | |
| 11,957,020 | B2 | 4/2024 | Ichihashi et al. | |
| 11,990,502 | B2 | 5/2024 | Kawashima et al. | |
| 12,027,528 | B2 | 7/2024 | Takahashi et al. | |
| 12,225,761 | B2 | 2/2025 | Ikeda et al. | |
| 2008/0055555 | A1 | 3/2008 | Nakamura et al. | |
| 2010/0182223 | A1 * | 7/2010 | Choi | H10D 86/423 345/76 |
| 2013/0146931 | A1 | 6/2013 | Liu et al. | |
| 2014/0367705 | A1 | 12/2014 | Bibl et al. | |
| 2019/0081089 | A1 * | 3/2019 | Cho | H10D 86/431 |
| 2019/0355874 | A1 * | 11/2019 | Herner | H01L 33/62 |
| 2020/0168777 | A1 | 5/2020 | Kang | |
| 2021/0082892 | A1 | 3/2021 | Kanaya et al. | |
| 2021/0295780 | A1 | 9/2021 | Ikeda et al. | |
| 2023/0402280 | A1 | 12/2023 | Tanemura et al. | |
| 2024/0355829 | A1 | 10/2024 | Takahashi et al. | |
| 2025/0151512 | A1 | 5/2025 | Ikeda et al. | |

FOREIGN PATENT DOCUMENTS

| | | | |
|---|---|---|---|
| EP | 3745168 | A | 12/2020 |
| JP | 2008-058535 | A | 3/2008 |
| JP | 2015-197994 | A | 11/2015 |
| JP | 2019-161172 | A | 9/2019 |
| JP | 2019-212694 | A | 12/2019 |
| JP | 2020-088392 | A | 6/2020 |
| KR | 2018-0015574 | A | 2/2018 |
| KR | 10-2030323 | | 10/2019 |
| TW | 201921329 | | 6/2019 |
| TW | 201943099 | | 11/2019 |
| WO | WO-2019/043483 | | 3/2019 |
| WO | WO-2019/1 46525 | | 8/2019 |
| WO | WO-2019/176326 | | 9/2019 |
| WO | WO-2019/215530 | | 11/2019 |
| WO | WO-2019/220278 | | 11/2019 |
| WO | WO-2019/230260 | | 12/2019 |
| WO | WO-2020/008294 | | 1/2020 |

OTHER PUBLICATIONS

International Search Report (Application No. PCT/IB2021/050762) Dated Apr. 27, 2021.
Written Opinion (Application No. PCT/IB2021/050762) Dated Apr. 27, 2021.

* cited by examiner 100A
110
104
14
103
102
188
13
193
187
186
12
185
183
182
181
163
162
142
141
11
139
132
151
120
130

FIG. 12A
FIG. 12C
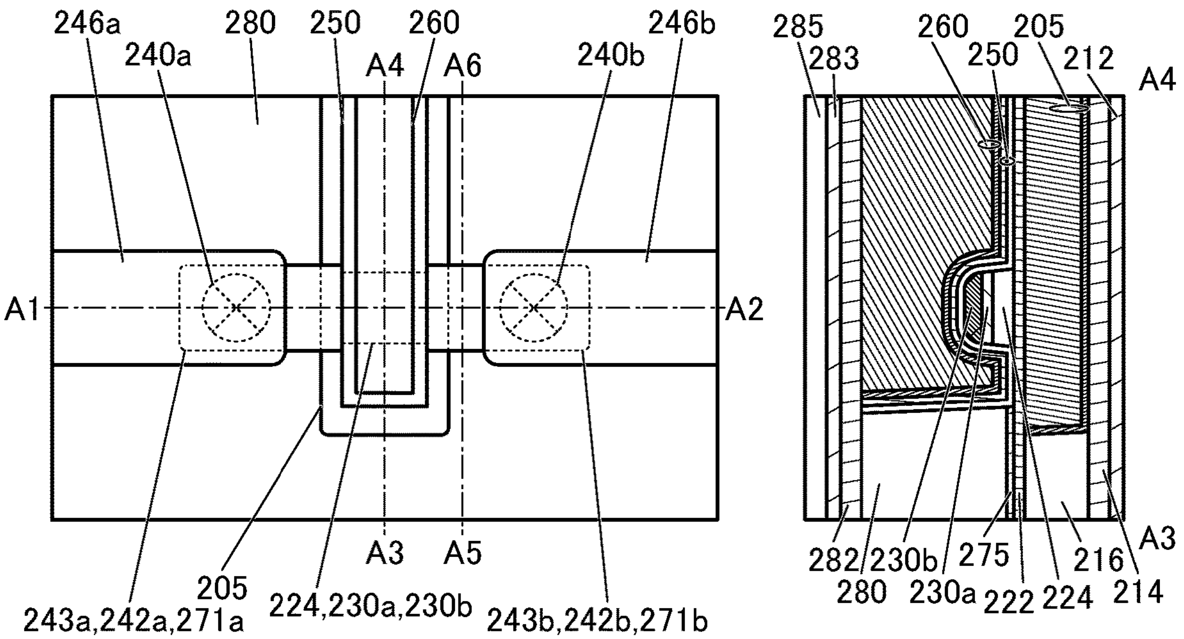
FIG. 12B
FIG. 12D
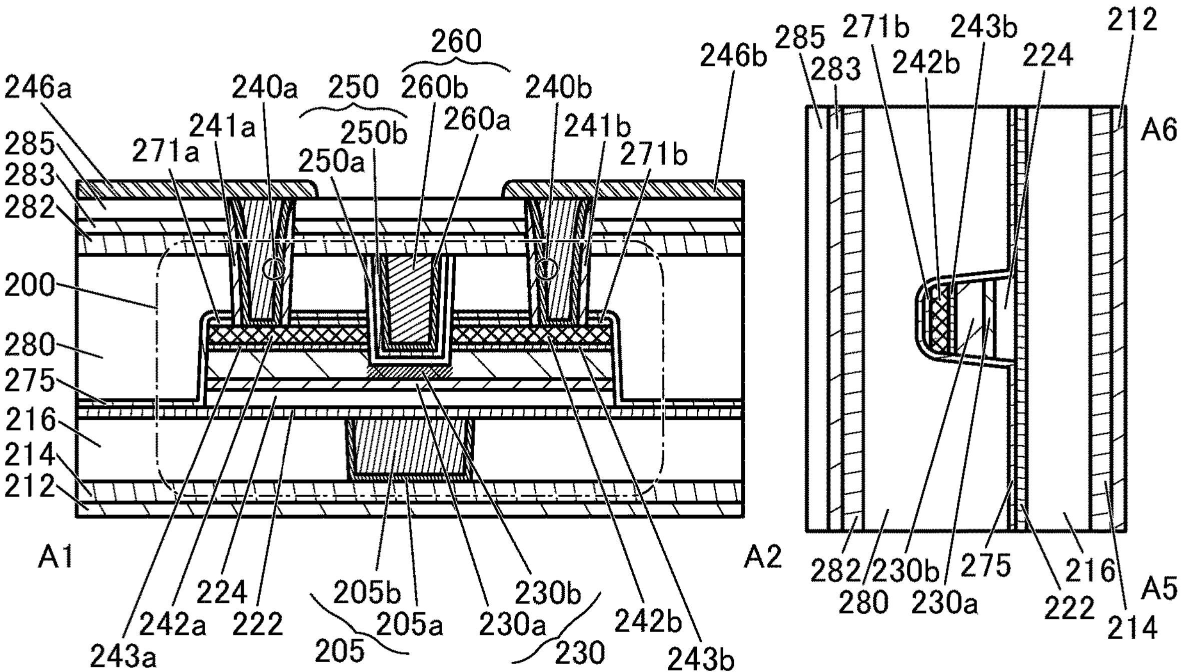

7100

7101

7000

7103

7111

7200

7211

7000

7212

7213

7214

FIG. 19A
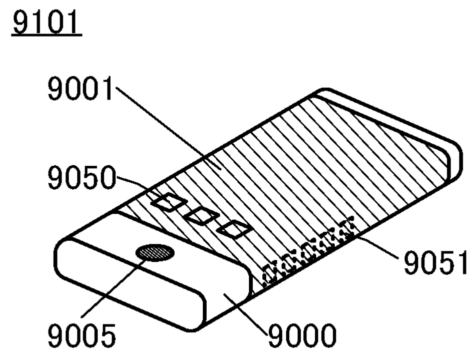
FIG. 19C
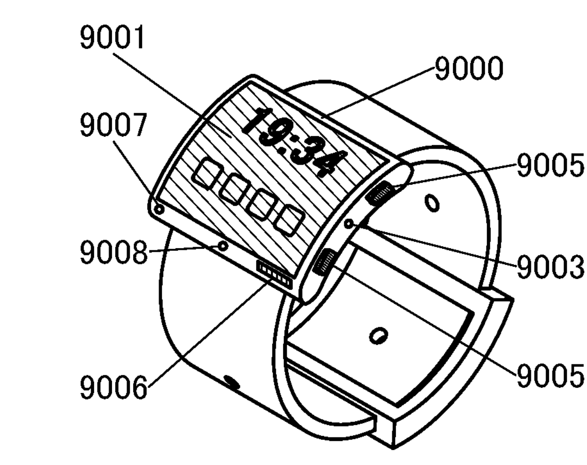
FIG. 19B
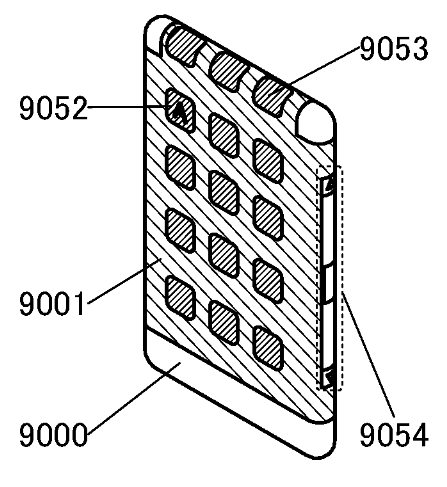
FIG. 19D
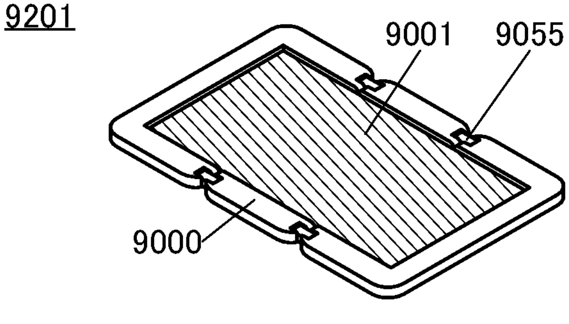
FIG. 19E
FIG. 19F
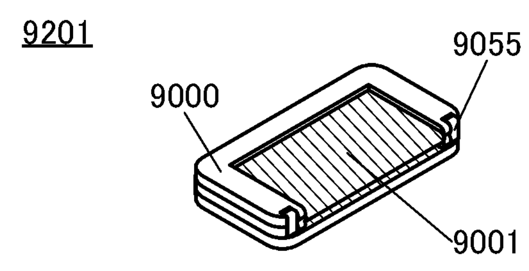

DISPLAY APPARATUS AND ELECTRONIC DEVICE

CROSS REFERENCE TO RELATED APPLICATIONS

This application is a U.S. National Phase Application under 35 U.S.C. § 371 of International Application PCT/IB2021/050762, filed on Feb. 1, 2021, which is incorporated by reference and claims the benefit of a foreign priority application filed in Japan on Feb. 14, 2020, as Application No. 2020-023149.

TECHNICAL FIELD

One embodiment of the present invention relates to a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

A display apparatus including highly reliable light-emitting diodes (LEDs) as display devices (also referred to as display elements) has been proposed (e.g., Patent Document 1 and Patent Document 2). In particular, a display apparatus including micro LEDs has advantages of high luminance, high contrast, a long lifetime, and the like, and has been actively developed as a next-generation display apparatus.

REFERENCE

Patent Document

[Patent Document 1] Japanese Published Patent Application No. 2008-58535

[Patent Document 2] Specification of United States Patent Application Publication No. 2014/0367705

SUMMARY OF THE INVENTION

Problems to be Solved by the Invention

In order to form an LED emitting light of red (R), green (G), blue (B), or the like, a compound semiconductor that has a band gap appropriate for each emission color is needed. Note that the band gaps of compound semiconductors having the same combination of elements can be varied by controlling the atomic ratio of the elements, introducing an impurity, or the like. The manufacturing process of a display apparatus can be simplified when an LED emitting R light, an LED emitting G light, and an LED emitting B light can be formed separately over one substrate.

However, formation of LED chips of different emission colors over one semiconductor substrate needs many steps and thus is difficult under the present situation. Therefore, the process for manufacturing a display apparatus has been attempted in which LED chips are manufactured using different semiconductor substrates for different emission colors and picked and placed one by one.

However, the pick-and-place step of LED chips takes time and has a problem of a difficulty in reducing manufacturing cost. It is preferable that a plurality of LED chips be picked and placed at the same time to solve the problem. In addition, the use of a technique for converting an emission color of single-color LED chips can reduce manufacturing cost owing to mass-production of the LED chips.

In view of the above, an object of one embodiment of the present invention is to provide a highly reliable display apparatus at a low cost. Another object is to provide a small display apparatus. Another object is to provide a display apparatus showing high-quality images. Another object is to provide a display apparatus with low power consumption. Another object is to reduce manufacturing cost of a display apparatus using micro LEDs. Another object is to provide a novel display apparatus. Another object is to provide a manufacturing method of the display apparatus.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a transistor, a reflective layer, a light-emitting diode, a first insulating layer, and a second insulating layer. The transistor, the reflective layer, and the light-emitting diode include an overlap region. The reflective layer is provided over the transistor with the first insulating layer therebetween. The light-emitting diode is provided over the reflective layer with the second insulating layer therebetween. The light-emitting diode includes a semiconductor layer. The semiconductor layer includes a region in contact with the second insulating layer.

Furthermore, it is possible to include one or both of a color conversion layer and a coloring layer and a third insulating layer and to provide one or both of the color conversion layer and the coloring layer over the light-emitting diode with the third insulating layer therebetween. The color conversion layer preferably includes a phosphor or a quantum dot.

It is preferable that the transistor include a metal oxide in a channel formation region, and the metal oxide contain In, Zn, and M (M is one or more of Al, Ti, Ga, Ge, Sn, Y, Zr, La, Ce, Nd, and Hf).

Another embodiment of the present invention is a display apparatus including a first layer, a second layer, a third layer, and a fourth layer. The second layer and the third layer are provided between the first layer and the fourth layer. The second layer is provided between the first layer and the third layer. The first layer includes a first transistor. The second layer includes a second transistor. The third layer includes a reflective layer. The fourth layer includes a light-emitting diode. The first transistor, the second transistor, the reflective layer, and the light-emitting diode include an overlap region. A first insulating layer is provided between the first transistor and the second transistor. A second insulating layer is provided between the second transistor and the reflective layer. A third insulating layer is provided between the reflective layer and the light-emitting diode. The light-emitting diode includes a semiconductor layer. The semiconductor layer includes a region in contact with the third insulating layer.

In addition, it is possible that a fifth layer is included, the fifth layer is provided so that the fourth layer is positioned between the fifth layer and the third layer, the fifth layer includes one or both of a color conversion layer and a coloring layer, one or both of the color conversion layer and the coloring layer, the first transistor, the second transistor, the reflective layer, and the light-emitting diode include an overlap region, and a fourth insulating layer is provided between the light-emitting diode and one or both of the color conversion layer and the coloring layer.

The color conversion layer preferably includes a phosphor or a quantum dot.

It is preferable that the first transistor include silicon in a channel formation region. Furthermore, it is preferable that the second transistor include a metal oxide in a channel formation region, and the metal oxide contain In, Zn, and M (M is one or more of Al, Ti, Ga, Ge, Sn, Y, Zr, La, Ce, Nd, and Hf).

It is possible that the first transistor is a component of a circuit for driving a pixel circuit, and the second transistor is a component of the pixel circuit.

In the above two embodiments of the present invention, the semiconductor layer is preferably a compound semiconductor containing a Group 13 element and a Group 15 element. The light-emitting diode preferably emits blue light, bluish violet light, violet light, or ultraviolet light.

Effect of the Invention

According to one embodiment of the present invention, a highly reliable display apparatus can be provided at a low cost. A small display apparatus can be provided. A display apparatus showing high-quality images can be provided. A display apparatus with low power consumption can be provided. Manufacturing cost of a display apparatus using micro LEDs can be reduced. A novel display apparatus can be provided. A manufacturing method of the display apparatus can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 10 is a diagram illustrating a display apparatus.

FIG. 12A is a top view illustrating an example of a transistor. FIG. 12B to FIG. 12D are cross-sectional views illustrating an example of the transistor.

FIG. 19A to FIG. 19F are diagrams illustrating examples of electronic devices.

MODE FOR CARRYING OUT THE INVENTION

Figure 1:
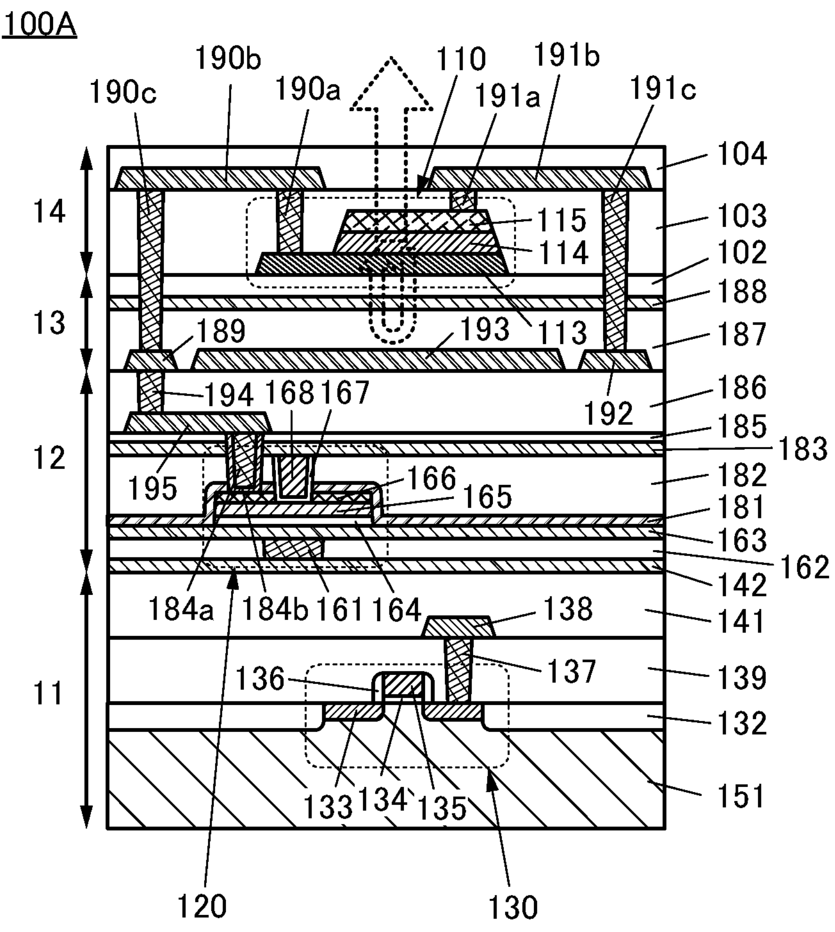
FIG. 1 is a diagram illustrating a display apparatus.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of embodiments below.

Note that in structures of the invention described below, the same reference numerals are used in common for the same portions or portions having similar functions in different drawings, and a repeated description thereof is omitted. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display apparatus of one embodiment of the present invention is described with reference to drawings.

The display apparatus of this embodiment includes a light-emitting diode included in a pixel circuit, a transistor included in the pixel circuit, and a transistor included in a driver circuit of the pixel circuit, and has a structure in which they are stacked to have an overlap region. With such a structure, the display apparatus can be downsized.

Furthermore, in a manufacturing method of the display apparatus of this embodiment, a plurality of light-emitting diodes can be attached in one step to a circuit board provided with transistors and the like. Thus, even in the case where a display apparatus including a large number of pixels or a high-resolution display apparatus is manufactured, the manufacturing time of a display apparatus can be shortened as compared to a method in which light-emitting diodes are mounted on a circuit board one by one. In addition, the degree of difficulty in manufacturing the display apparatus can be reduced.

FIG. 1 is a cross-sectional view of a display apparatus 100A that is one embodiment of the present invention. The display apparatus 100A has a structure in which a layer 11 provided with a transistor and the like included in a driver circuit and the like of a pixel circuit, a layer 12 provided with a transistor and the like included in the pixel circuit, a layer 13 provided with a reflective layer, and a layer 14 provided with a light-emitting device such as a light-emitting diode (also referred to as a light-emitting element) and the like included in the pixel circuit are stacked in this order.

Although the display apparatus is divided into a plurality of layers for convenience of the description in this embodiment, the boundaries between the layers are not strictly defined. For example, in the case where a component described as a component of the layer 11 in this embodiment is positioned in the vicinity of the boundary between the layer 11 and the layer 12, the component can also be regarded as a component of the layer 12. Furthermore, the component may be positioned in a layer other than the layer 11 unless the function of the component is hindered. Moreover, in one embodiment of the present invention, if needed, an insulating layer and a conductive layer may be provided in addition to the insulating layers and the conductive layers included in the respective layers. Alternatively, some of the insulating layers and the conductive layers included in the respective layers may be omitted if needed.

For example, the layer 11 includes a transistor 130 that is a component of the driver circuit (one or both of a gate driver and a source driver) or the like of the pixel circuit. The transistor 130 needs to operate at high speed, and thus a transistor including silicon (single crystal silicon, polycrystalline silicon, amorphous silicon, or the like) in a channel formation region (hereinafter, Si transistor) is preferably used. FIG. 1 illustrates an example in which single crystal silicon is used for a substrate 151 and the transistor 130 includes a channel formation region in the substrate 151.

Note that part of the driver circuit of the pixel circuit may be provided in an external IC chip connected to the pixel circuit.

The transistor 130 includes a conductive layer 135, an insulating layer 134, an insulating layer 136, and a pair of low-resistance regions 133. The conductive layer 135 functions as a gate. The insulating layer 134 is positioned between the conductive layer 135 and the substrate 151 and functions as a gate insulating layer. The insulating layer 136 is provided to cover the side surface of the conductive layer 135 and functions as a sidewall. The pair of low-resistance regions 133 are regions doped with an impurity in the substrate 151; one of them functions as a source of the transistor 130 and the other functions as a drain of the transistor 130. Furthermore, an element isolation layer 132 is provided around the transistor 130.

An insulating layer 139 is provided to cover the transistor 130, and a conductive layer 138 is provided over the insulating layer 139. A conductive layer 137 is embedded in an opening portion provided in the insulating layer 139. The conductive layer 138 is electrically connected to one of the pair of low-resistance regions 133 through the conductive layer 137. An insulating layer 141 is provided to cover the conductive layer 138. The conductive layer 138 functions as a wiring. The wiring can electrically connect any of another transistor of the circuit including the transistor 130 as a component, the pixel circuit, another circuit, and the like to each other.

The layer 12 includes a transistor 120 that is a component of the pixel circuit, an insulating layer 142, an insulating layer 162, an insulating layer 181, an insulating layer 182, an insulating layer 183, a conductive layer 184*a*, a conductive layer 184*b*, an insulating layer 185, an insulating layer 186, a conductive layer 194, and a conductive layer 195. One or more of these components are sometimes considered as components of a transistor, but are not regarded as components of a transistor in the description in this embodiment. Note that each of the conductive layers and the insulating layers included in the layer 12 may have a single-layer structure or a stacked-layer structure.

The insulating layer 142 is provided over the layer 11. The insulating layer 142 functions as a barrier layer that inhibits diffusion of impurities such as water and hydrogen from the layer 11 into the transistor 120 and release of oxygen from a metal oxide layer 165 to the insulating layer 142 side. As the insulating layer 142, a film through which hydrogen and oxygen are less likely to diffuse than through a silicon oxide film, such as an aluminum oxide film, a hafnium oxide film, or a silicon nitride film, can be used, for example.

The transistor 120 includes a conductive layer 161, an insulating layer 163, an insulating layer 164, the metal oxide layer 165, a pair of conductive layers 166, an insulating layer 167, a conductive layer 168, and the like. A specific example of a transistor that can be used in the display apparatus of one embodiment of the present invention will be described in detail in Embodiment 3.

The transistor 120 is preferably a transistor including the metal oxide layer 165 in a channel formation region (hereinafter, OS transistor). The metal oxide layer 165 includes a first region overlapping with one of the pair of conductive layers 166, a second region overlapping with the other of the pair of conductive layers 166, and a third region between the first region and the second region.

An OS transistor does not require a bonding step or the like and can be formed in a region overlapping with a Si transistor with an insulating layer and the like therebetween. Accordingly, a stacked-type device can be manufactured in a simple process and manufacturing cost can be reduced.

An OS transistor has features of capability of high speed operation owing to high mobility, high reliability, and the like as compared with a transistor using amorphous silicon. A metal oxide used for an OS transistor can be formed in a deposition step, so that a laser apparatus and the like required for the crystallization step of polycrystalline silicon can be omitted. Accordingly, a highly reliable display apparatus can be manufactured at a low cost with an OS transistor.

The conductive layer 161 and the insulating layer 162 are provided over the insulating layer 142, and the insulating layer 163 is provided to cover the conductive layer 161 and the insulating layer 162. The insulating layer 164 is provided over the insulating layer 163, and the metal oxide layer 165 is provided over the insulating layer 164.

The conductive layer 161 functions as a gate electrode, and the insulating layer 163 and the insulating layer 164 function as gate insulating layers. The conductive layer 161 includes a region overlapping with the metal oxide layer 165 with the insulating layer 163 and the insulating layer 164 therebetween. Like the insulating layer 142, the insulating layer 163 is preferably formed using a material that functions as a barrier layer. As the insulating layer 164 in contact with the metal oxide layer 165, an oxide insulating film such as a silicon oxide film is preferably used.

The pair of conductive layers 166 are provided over the metal oxide layer 165 to be apart from each other. One of the pair of conductive layers 166 functions as a source of the transistor and the other functions as a drain. The insulating layer 181 is provided to cover the metal oxide layer 165 and the pair of conductive layers 166, and the insulating layer 182 is provided over the insulating layer 181.

An opening portion reaching the metal oxide layer 165 is provided in the insulating layer 181 and the insulating layer 182, and the insulating layer 167 and the conductive layer 168 are embedded in the opening portion. The opening portion is provided in a position overlapping with the third region of the metal oxide layer 165. The insulating layer 167 includes a region overlapping with the side surface of the insulating layer 181 and the side surface of the insulating layer 182. The conductive layer 168 includes a region overlapping with the side surface of the insulating layer 181 and the side surface of the insulating layer 182 with the insulating layer 167 therebetween.

The conductive layer 168 functions as a gate electrode, and the insulating layer 167 functions as a gate insulating layer. The conductive layer 168 includes a region overlapping with the metal oxide layer 165 with the insulating layer 167 therebetween.

The insulating layer 183 and the insulating layer 185 are provided to cover the top surfaces of the insulating layer 182, the insulating layer 167, and the conductive layer 168.

The insulating layer 181 and the insulating layer 183 are each preferably formed using a material that functions as a barrier layer like the insulating layer 142. When the pair of conductive layers 166 is covered with the insulating layer 181, oxidation of the pair of conductive layers 166 due to oxygen contained in the insulating layer 182 can be inhibited.

A plug electrically connected to one of the pair of conductive layers 166 and the conductive layer 195 is embedded in an opening portion provided in the insulating layer 181, the insulating layer 182, the insulating layer 183, and the insulating layer 185. The plug can include a conductive layer 184*b* in contact with the side surface of the opening portion and the top surface of one of the pair of conductive layers 166, and a conductive layer 184*a* embedded inside the conductive layer 184*b*. The conductive layer 184*b* is preferably formed using a conductive material through which hydrogen and oxygen are less likely to diffuse.

The conductive layer 195, the conductive layer 194, and the insulating layer 186 are provided over the insulating layer 185. The conductive layer 195 functions as a wiring electrically connecting the transistor 120 to a light-emitting diode 110 provided in the layer 14. The conductive layer 194 functions as a plug electrically connecting the transistor 120 to the light-emitting diode 110.

Examples of materials that can be used for the conductive layer 194 and the conductive layer 195 include metal such as aluminum, titanium, chromium, nickel, copper, yttrium, zirconium, tin, zinc, silver, platinum, gold, molybdenum, tantalum, and tungsten, and an alloy containing the metal as its main component (e.g., an alloy of silver, palladium, and copper (Ag—Pd—Cu (APC))). Alternatively, an oxide such as tin oxide or zinc oxide may be used. Further alternatively, the conductive layer 194 and the conductive layer 195 may each be a stack of two or more of the above materials.

The insulating layer 186 can have a planarization function. The insulating layer 186 is preferably formed using a single layer or a stack including one or more of inorganic insulating materials such as silicon oxide, silicon oxynitride, silicon nitride oxide, silicon nitride, aluminum oxide, hafnium oxide, and titanium nitride.

In the layer 13, a conductive layer 189, a conductive layer 192, a reflective layer 193, and an insulating layer 187 covering these are provided. The conductive layer 189 and the conductive layer 192 function as wirings electrically connected to the light-emitting diode 110. The reflective layer 193 is provided in a position overlapping with the light-emitting diode 110 provided in the layer 14 and has a function of reflecting light emitted from the light-emitting diode 110 to the layer 12 side. With the reflective layer 193, the direction of light emitted from the light-emitting diode 110 can be adjusted to the outside of the layer 14 (the side opposite to the surface of the layer 14 in contact with the layer 13).

Note that the reflective layer 193 preferably includes a region overlapping also with the transistor 120 included in the layer 12. The reflective layer 193 can block light emitted from the light-emitting diode 110 to the direction of the layer 12, and can inhibit characteristic change caused when the transistor 120 is irradiated with light. For a similar reason, the reflective layer 193 preferably includes a region overlapping also with the transistor 130 included in the layer 11.

Note that a transistor including a region overlapping with the reflective layer 193 may be one of the transistors included in the layer 12 and the layer 11. It is not necessary to block light as long as the characteristic change of a transistor caused by light irradiation is within the allowable range. A wiring or an electrode provided in the layer 12, the layer 13, or the like functions as a light-blocking layer in some cases.

The reflective layer 193 is preferably formed using a material having high reflectivity of light emitted from the light-emitting diode 110 included in the layer 14. Examples of a material include metal such as aluminum, titanium, chromium, nickel, copper, yttrium, zirconium, tin, zinc, silver, platinum, gold, molybdenum, tantalum, and tungsten, and an alloy containing the metal as its main component (e.g., an alloy of silver, palladium, and copper (Ag—Pd—Cu (APC))). Alternatively, the reflective layer 193 may be a stack of two or more of the above materials.

The insulating layer 187 is provided over the conductive layer 189, the conductive layer 192, and the reflective layer 193. An insulating layer 188 is provided over the insulating layer 187. An insulating layer 102 is provided over the insulating layer 188.

One of the pair of conductive layers 166 of the transistor 120 is electrically connected to the conductive layer 189 through the conductive layer 184*a* and the conductive layer 184*b*.

The insulating layer 186 and the insulating layer 187 can each have a planarization function. The insulating layer 186 and the insulating layer 187 are each preferably formed using a single layer or a stack including one or more of inorganic insulating materials such as silicon oxide, silicon oxynitride, silicon nitride oxide, silicon nitride, aluminum oxide, hafnium oxide, and titanium nitride.

In this specification and the like, silicon oxynitride refers to a material containing silicon, oxygen, and nitrogen, in which the oxygen content is higher than the nitrogen content. Silicon nitride oxide refers to a material containing silicon, oxygen, and nitrogen, in which the nitrogen content is higher than the oxygen content.

The insulating layer 188 can function as a barrier layer that prevents diffusion of impurities (e.g., hydrogen and water) from the layer 14 into the transistor 120. As the insulating layer 188, a film through which hydrogen and oxygen are less likely to diffuse than through a silicon oxide film, such as an aluminum oxide film, a hafnium oxide film, or a silicon nitride film, can be used, for example.

The insulating layer 102 is preferably formed using a single layer or a stack including one or more of inorganic insulating materials such as silicon oxide, silicon oxynitride, silicon nitride oxide, silicon nitride, aluminum oxide, hafnium oxide, and titanium nitride.

The transistor 120 can be used as a transistor included in the pixel circuit. The transistor 130 can be used as a transistor included in the driver circuit (e.g., one or both of a gate driver and a source driver) for driving the pixel circuit. Note that the transistor 130 may be a transistor included in the pixel circuit. Moreover, the transistors 120 and 130 can also be used as transistors included in a variety of circuits such as an arithmetic circuit and a memory circuit.

With such a structure, not only the components such as the transistor included in the pixel circuit but also the components such as the transistor included in the driver circuit can be formed directly under the light-emitting diode; thus, the display apparatus can be downsized as compared with the case where the driver circuit is provided outside a display portion. In addition, the display apparatus can have a narrow bezel (narrow non-display region).

The layer 14 includes the light-emitting diode 110, an insulating layer 103, and an insulating layer 104. Each of the insulating layer 102, the insulating layer 103, and the insulating layer 104 may have a single-layer structure or a stacked-layer structure.

The light-emitting diode 110 includes a semiconductor layer 113, a light-emitting layer 114, and a semiconductor layer 115, which are provided in this order over the layer 13. Note that the light-emitting diode 110 may further include a plurality of layers.

The insulating layer 103 is provided to cover the insulating layer 102, the semiconductor layer 113, the light-emitting layer 114, and the semiconductor layer 115. The insulating layer 103 preferably has a planarization function. The insulating layer 104 is provided over the insulating layer 103.

A conductive layer 190*a* and a conductive layer 191*a* are provided in opening portions provided in the insulating layer 103. A conductive layer 190*c* and a conductive layer 191*c* are provided in opening portions provided in the insulating layer 103, the insulating layer 102, the insulating layer 188, and the insulating layer 187. The conductive layer 190*a*, the conductive layer 190*c*, the conductive layer 191*a*, and the conductive layer 191*c* each function as a plug electrically connecting components.

The semiconductor layer 113 is electrically connected to the conductive layer 189 through the conductive layer 190*a*, a conductive layer 190*b*, and the conductive layer 190*c*. The semiconductor layer 115 is electrically connected to the conductive layer 192 through the conductive layer 191*a*, a conductive layer 191*b*, and the conductive layer 191*c*. Here, the conductive layer 190*b* and the conductive layer 191*b* function as connection wirings.

The insulating layer 103, the insulating layer 104, the insulating layer 139, the insulating layer 141, the insulating layer 162, the insulating layer 182, and the insulating layer 185 are each preferably formed using a single layer or a stack including one or more of inorganic insulating materials such as silicon oxide, silicon oxynitride, silicon nitride oxide, silicon nitride, aluminum oxide, hafnium oxide, and titanium nitride.

Examples of materials that can be used for the conductive layer 190*a* to the conductive layer 190*c* and the conductive layer 191*a* to the conductive layer 191*c* include metal such as aluminum, titanium, chromium, nickel, copper, yttrium, zirconium, tin, zinc, silver, platinum, gold, molybdenum, tantalum, and tungsten, and an alloy containing the metal as its main component (e.g., an alloy of silver, palladium, and copper (Ag—Pd—Cu (APC))). Alternatively, an oxide such as tin oxide or zinc oxide may be used. Further alternatively, the conductive layer 190*a* to the conductive layer 190*c* and the conductive layer 191*a* to the conductive layer 191*c* may each be a stack of two or more of the above materials.

The light-emitting layer 114 is positioned between the semiconductor layer 113 and the semiconductor layer 115. In the light-emitting layer 114, electrons and holes are combined to emit light. An n-type semiconductor layer can be used as one of the semiconductor layer 113 and the semiconductor layer 115, and a p-type semiconductor layer can be used as the other. An n-type semiconductor layer, an i-type semiconductor layer, or a p-type semiconductor layer can be used as the light-emitting layer 114.

A stacked-layer structure including the semiconductor layer 113, the light-emitting layer 114, and the semiconductor layer 115 is formed so as to emit red light, green light, blue light, bluish violet light, violet light, ultraviolet light, or the like. For the stacked-layer structure, for example, a compound containing a Group 13 element and a Group 15 element (also referred to as a Group III-V compound) can be used. Examples of the Group 13 element include aluminum, gallium, and indium. Examples of the Group 15 element include nitrogen, phosphorus, arsenic, and antimony.

For example, a pn junction or a pin junction is formed using a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like to form a light-emitting diode emitting target light. Note that a compound other than the above may also be used.

The pn junction or the pin junction may be not only a homojunction but also a heterojunction or a double heterojunction. Alternatively, an LED having a quantum well junction, a nanocolumn LED, or the like may be used.

For example, a material such as gallium nitride can be used for a light-emitting diode emitting light in the ultraviolet wavelength range to the blue wavelength range. A material such as a compound of indium and gallium nitride can be used for a light-emitting diode emitting light in the ultraviolet wavelength range to the green wavelength range. A material such as a compound of aluminum, gallium, indium, and phosphorus or a compound of gallium and arsenic can be used for a light-emitting diode emitting light in the green wavelength range to the red wavelength range. A material such as a compound of gallium and arsenic can be used for a light-emitting diode emitting light in the infrared wavelength range.

In the case where a plurality of light-emitting diodes 110 provided over the same plane can emit light of different colors such as R (red), G (green), and B (blue), for example, a color image can be displayed without using a color conversion layer. Accordingly, a step of forming a color conversion layer is unnecessary, and manufacturing cost of the display apparatus can be reduced.

Alternatively, all light-emitting diodes 110 provided over the same plane may emit light of the same color. In this case, light emitted from the light-emitting layer 114 is extracted to the outside of the display apparatus through one or both of a color conversion layer and a coloring layer. This structure will be described in detail in Embodiment 2 of the display apparatus.

The display apparatus of this embodiment may include a light-emitting diode emitting infrared light. The light-emitting diode emitting infrared light can be used as a light source of an infrared light sensor, for example.

Figures 2A, 2B:
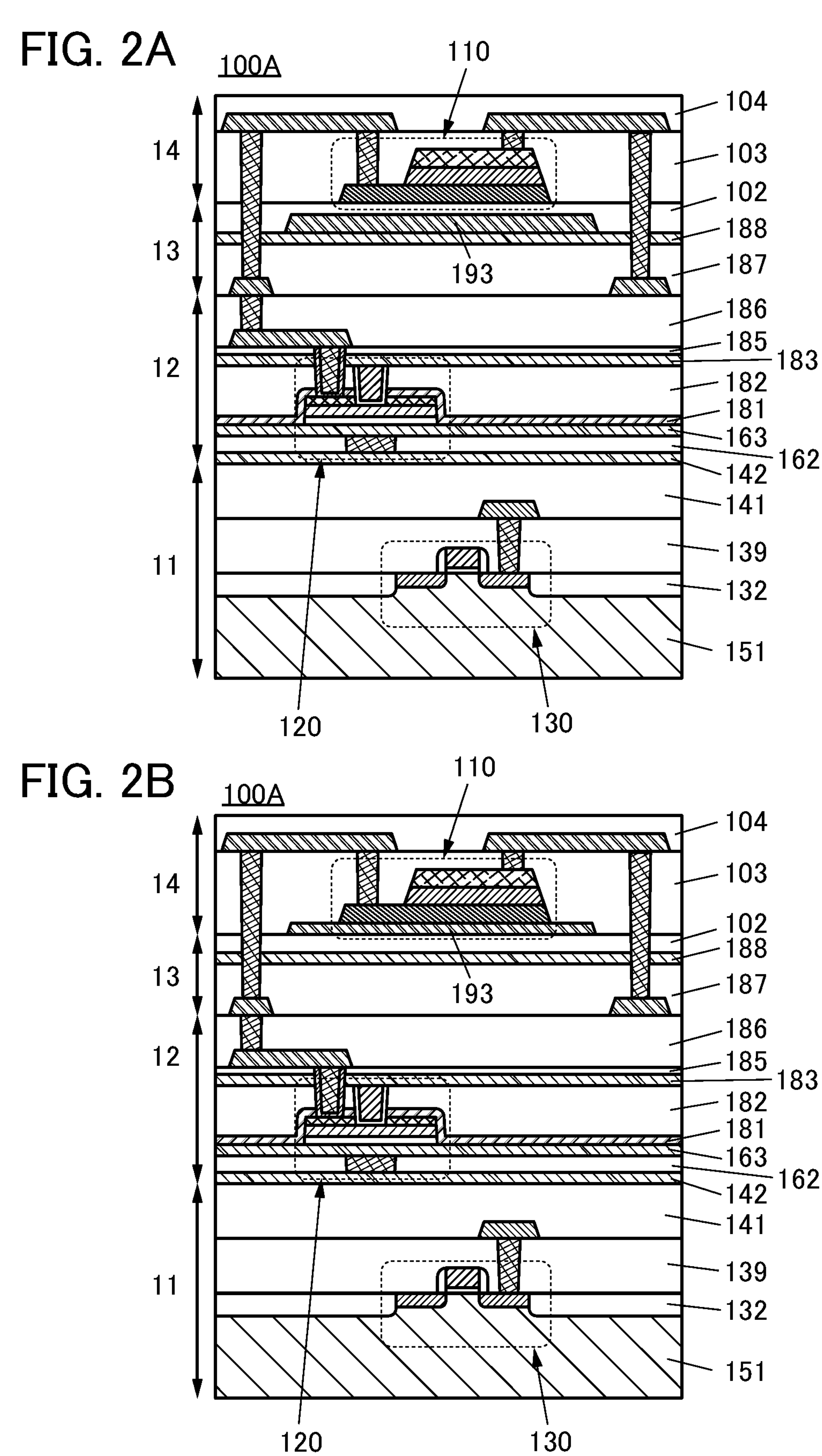
FIG. 2A and FIG. 2B are diagrams each illustrating a display apparatus.

Although FIG. 1 illustrates a mode in which the reflective layer 193 can be formed using the same material in the same step as the conductive layer 189 and the conductive layer 192, the reflective layer 193 may be provided in a layer different from the layer provided with the conductive layer 189 and the conductive layer 192. For example, as illustrated in FIG. 2A, a structure may be employed in which the reflective layer 193 is provided over the insulating layer 188 and covered with the insulating layer 102. Alternatively, as illustrated in FIG. 2B, the reflective layer 193 may be provided between the insulating layer 102 and the light-emitting diode 110. In this case, the reflective layer 193 may be in contact with the semiconductor layer 113 and function as one electrode layer of the light-emitting diode 110.

The light-emitting diode 110 is formed in such a manner that a separately formed stacked-layer structure of a compound semiconductor and the like is fixed to the insulating layer 102 and processed into a structure as illustrated in FIG. 1. A method for forming the light-emitting diode 110 is described with reference to FIG. 3A to FIG. 3D, FIG. 4A to FIG. 4D, and FIG. 5A to FIG. 5D.

Figures 3A, 3B, 3C, 3D:
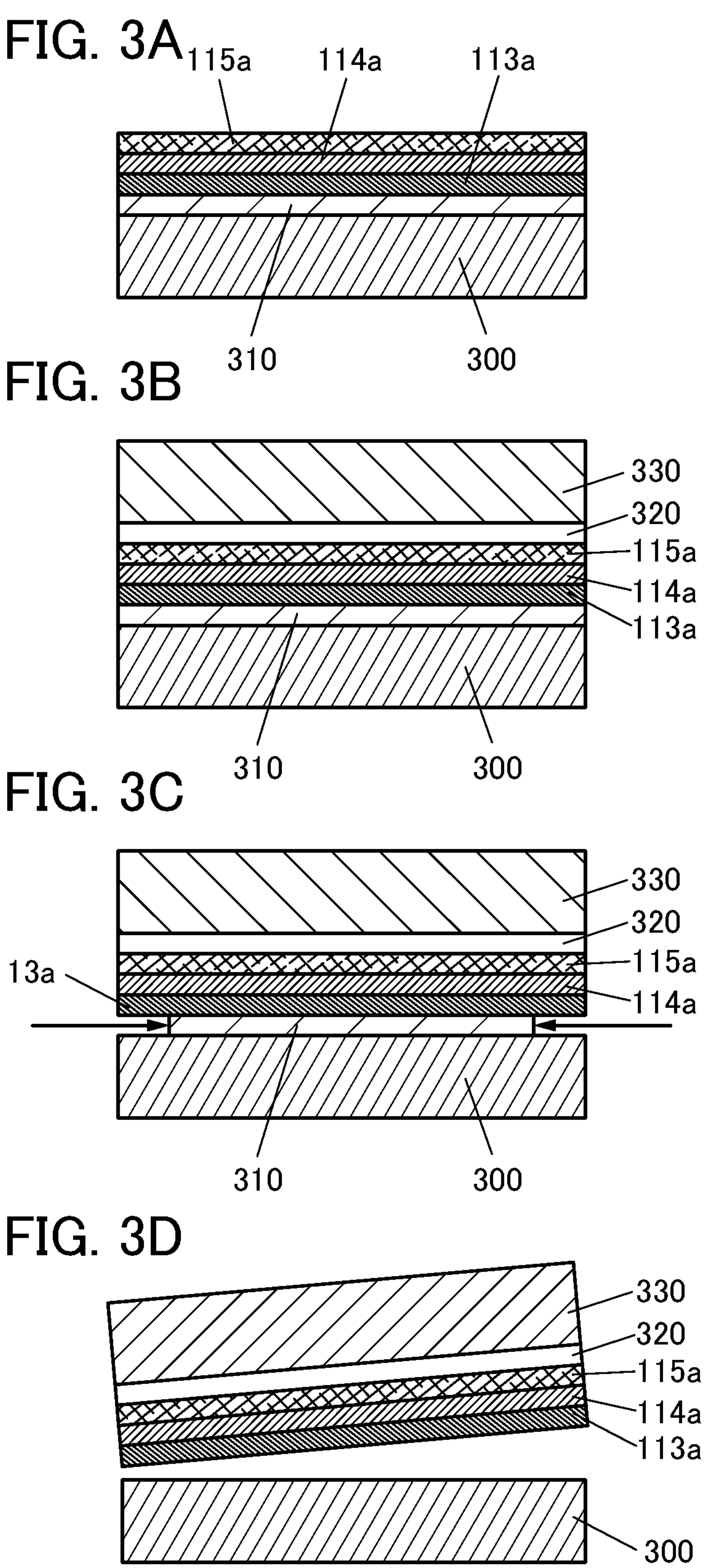
FIG. 3A to FIG. 3D are diagrams illustrating a manufacturing method of a light-emitting diode.

A separation layer 310, a semiconductor layer 113*a*, a light-emitting layer 114*a*, and a semiconductor layer 115*a* are provided over a substrate 300 (see FIG. 3A).

As the substrate 300, a single crystal substrate such as a sapphire ($Al_2O_3$) substrate, a silicon carbide (SiC) substrate, a silicon (Si) substrate, or a compound semiconductor substrate can be used. The above-described compound containing the Group 13 element and the Group 15 element can be used as the compound semiconductor. The substrate 300 is preferably formed using a material having the same lattice constant as or slightly different lattice constant from the light-emitting layer 114*a* and the like for the epitaxial growth of the light-emitting layer 114*a* and the like.

For example, in the case where a light-emitting diode emitting red light is formed, gallium aluminum arsenide (AlGaAs) or the like can be used for the light-emitting layer 114*a* or the like. In this case, a gallium arsenide (GaAs) substrate or the like can be used as the substrate 300.

The separation layer 310 is provided over the substrate 300. The separation layer 310 is provided to lift-off a stack body including the semiconductor layer 113*a*, the light-emitting layer 114*a*, the semiconductor layer 115*a*, and the like from the substrate 300. The separation layer 310 is preferably formed using a material that can be easily removed by wet etching or the like in a later step. For example, aluminum arsenide (AlAs) or the like can be used.

The semiconductor layer 113*a*, the light-emitting layer 114*a*, and the semiconductor layer 115*a* are provided over the separation layer 310. The semiconductor layer 113*a* and the semiconductor layer 115*a* function as clad layers. For example, one of them can have p-type conductivity and the other can have n-type conductivity. Although the case where the basic structure of a light-emitting diode is a three-layer structure is described here, more layers may be included. Alternatively, a structure may be employed in which pn junction is formed by addition of an impurity to part of the light-emitting layer 114*a*. The semiconductor layer 113*a*, the light-emitting layer 114*a*, and the semiconductor layer 115*a* can be formed by epitaxial growth using an MOCVD method (metal organic chemical vapor deposition method) or the like, for example.

Next, an adhesive layer 320 and a substrate 330 are provided over the semiconductor layer 115*a* (see FIG. 3B). The substrate 330 can function as a support substrate in lifting-off the stack body including the semiconductor layer 113*a*, the light-emitting layer 114*a*, the semiconductor layer 115*a*, and the like. The adhesive layer 320 has a function of bonding the stack body to the substrate 330.

Note that the stack body may be processed into an island shape or a stripe shape before the adhesive layer 320 and the substrate 330 are provided over the semiconductor layer 115*a*.

A substrate having a flat surface is preferably used as the substrate 330. For example, a semiconductor substrate of silicon or the like, a glass substrate, a ceramic substrate, a metal substrate, a resin substrate, or the like can be used.

A material separable after bonding can be used for the adhesive layer 320. For example, an adhesive, a ultraviolet curable resin, a thermosetting resin, or a material soluble to water, an organic solvent, or the like can be used.

Next, the separation layer 310 is etched by wet etching using an acid or the like (see FIG. 3C), so that the substrate 300 is separated (see FIG. 3D).

Figure 4A:
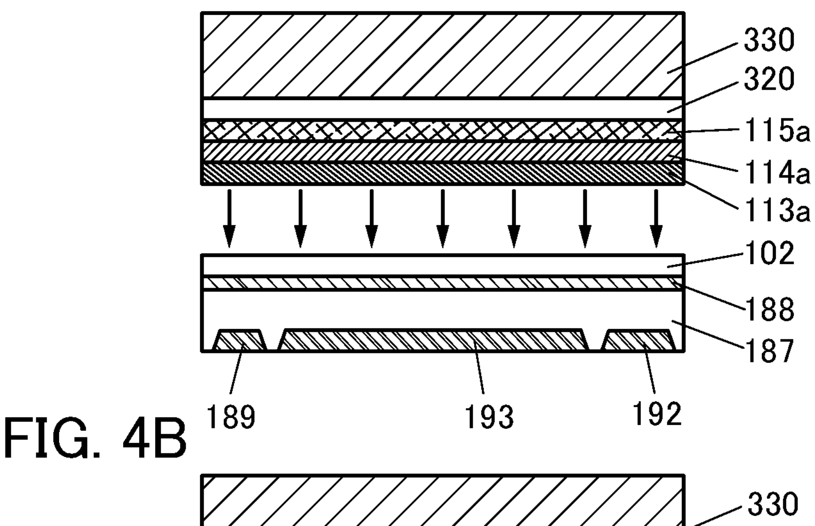
FIG. 4A to FIG. 4D are diagrams illustrating the manufacturing method of a light-emitting diode.
Figure 4B:
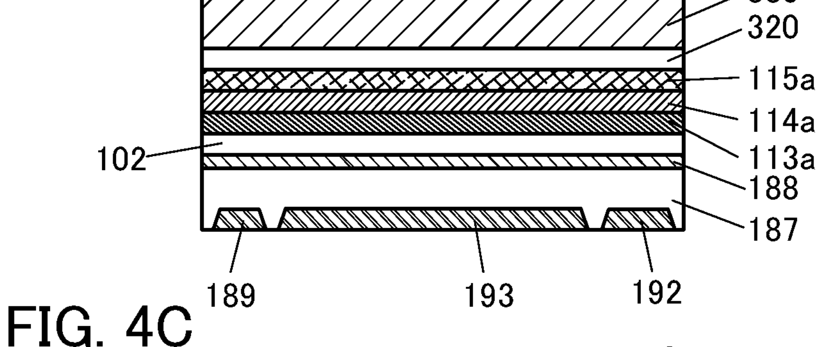

Next, the stack body including the semiconductor layer 113*a*, the light-emitting layer 114*a*, the semiconductor layer 115*a*, the adhesive layer 320, and the substrate 330 is fixed to a separately formed stack body including the layer 11, the layer 12, and the layer 13 (see FIG. 4A and FIG. 4B). Note that FIG. 4A and FIG. 4B illustrate the components of the layer 13 and the state where the surface of the semiconductor layer 113*a* exposed in FIG. 3D is fixed to the surface of the insulating layer 102.

Figure 4C:
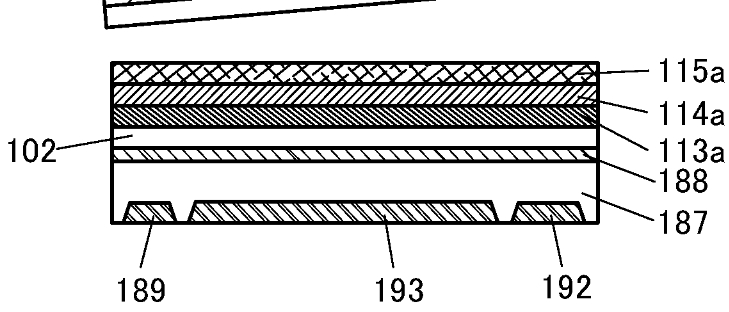

Next, the adhesive layer 320 and the substrate 330 are removed from the stack body in FIG. 4B (see FIG. 4C). The adhesive strength of the adhesive layer 320 to the semiconductor layer 115*a* can be weakened by curing or quality change. Alternatively, the adhesive layer 320 may be dissolved and the substrate 330 may be removed.

Figure 4D:
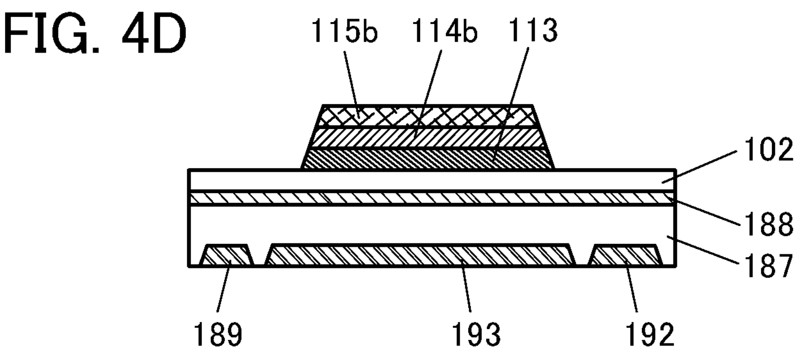

Next, the semiconductor layer 113*a*, the light-emitting layer 114*a*, and the semiconductor layer 115*a* are processed into island shapes to form the semiconductor layer 113, a light-emitting layer 114*b*, and a semiconductor layer 115*b* (see FIG. 4D).

Figure 5A:
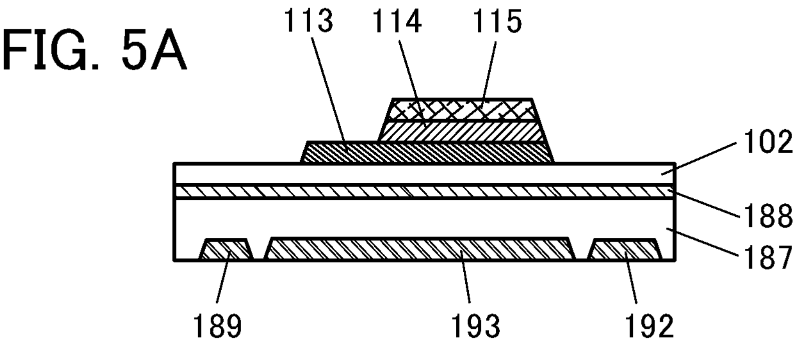
FIG. 5A to FIG. 5D are diagrams illustrating the manufacturing method of a light-emitting diode.

Next, the light-emitting layer 114*a* and the semiconductor layer 115*a* are processed and part of the surface of the semiconductor layer 113 is exposed so that a region for electrically connecting the semiconductor layer 113 to the conductive layer 190*a* is formed (see FIG. 5A). At this time, the stack of the semiconductor layer 113, the light-emitting layer 114, and the semiconductor layer 115 is formed.

Figure 5B:
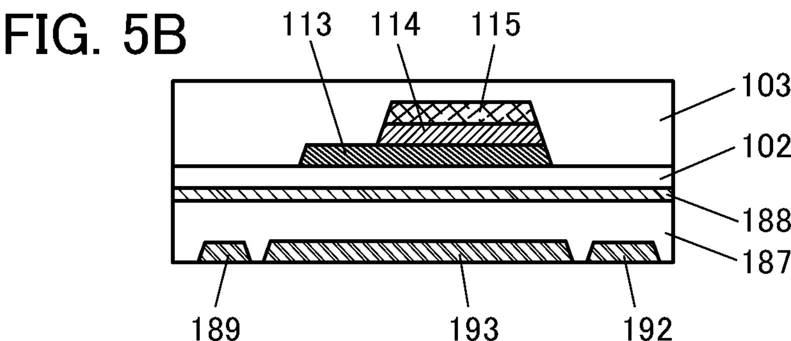
Figure 5C:
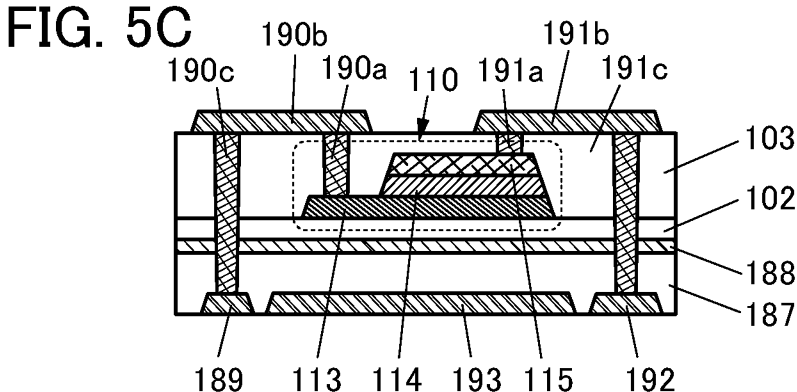

Next, the insulating layer 103 covering the stack of the semiconductor layer 113, the light-emitting layer 114, and the semiconductor layer 115 is formed (see FIG. 5B).

Next, the opening portion reaching the semiconductor layer 113 and the opening portion reaching the semiconductor layer 115 are formed in the insulating layer 103. Furthermore, the opening portion reaching the conductive layer 189 and the opening portion reaching the conductive layer 192 are formed in the insulating layer 103, the insulating layer 102, the insulating layer 187, and the insulating layer 186.

Next, the conductive layers (the conductive layer 190*a*, the conductive layer 190*c*, the conductive layer 191*a*, and the conductive layer 191*c*) are embedded in the respective opening portions. Here, the conductive layer 190*a* and the conductive layer 191*a* can serve as a pair of electrodes of the light-emitting diode 110. Note that conductive layers to serve as a pair of electrodes of the light-emitting diode 110 may be provided in contact with the semiconductor layer 113 and the semiconductor layer 115, one of the conductive layers may be electrically connected to the conductive layer 190*a*, and the other of the conductive layers may be electrically connected to the conductive layer 191*a*.

Then, the conductive layer 190*b* and the conductive layer 191*b* are formed over the insulating layer 103. The conductive layer 190*b* electrically connects the conductive layer 190*a* to the conductive layer 190*c*, and the conductive layer 191*b* electrically connects the conductive layer 191*a* to the conductive layer 191*c* (see FIG. 5C).

Figure 5D:
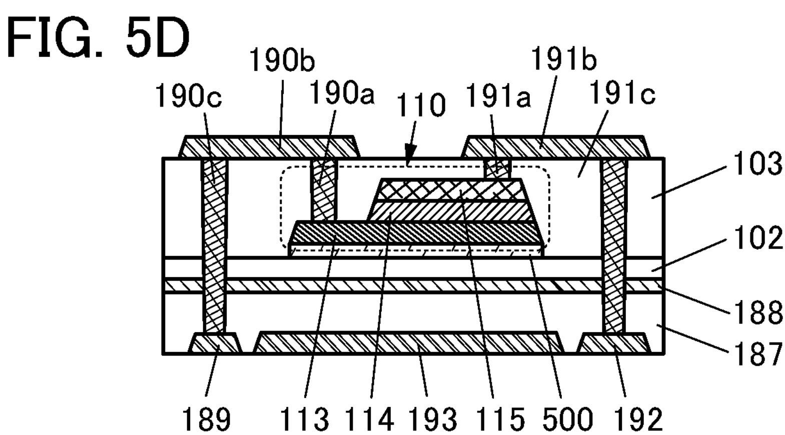

Although an example is described in the above in which the semiconductor layer 113 included in the light-emitting diode 110 is in contact with and fixed to the insulating layer 102, an adhesive layer 500 may be provided between the insulating layer 102 and the semiconductor layer 113 (see FIG. 5D). An insulating resin, a conductive resin (including a resin containing a conductive filler), or the like can be used for the adhesive layer 500. In the case of using a conductive resin for the adhesive layer 500, the adhesive layer 500 can function as one electrode layer of the light-emitting diode 110.

Through the above process, a light-emitting diode in which one of a pair of electrodes is electrically connected to the conductive layer 189 and the other of the pair of electrodes is electrically connected to the conductive layer 192 can be formed. Note that one light-emitting diode is illustrated in the diagrams used in describing the above process, and a plurality of light-emitting diodes can be formed at the same time through the above process. The above process is an example and a light-emitting diode may be formed through another process.

Figures 6A, 6B, 6C, 6D, 6E:
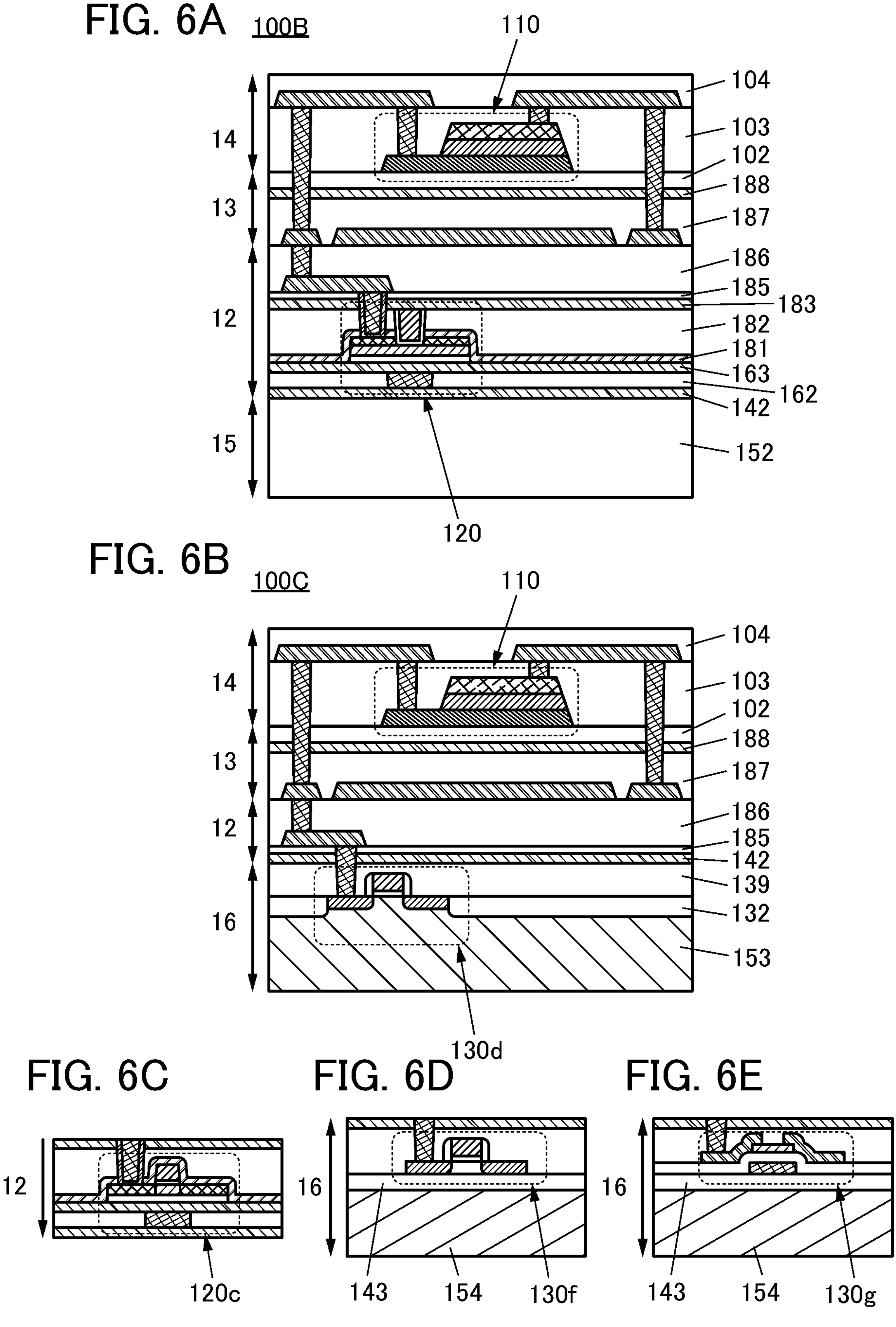
FIG. 6A and FIG. 6B are diagrams each illustrating a display apparatus.
FIG. 6C to FIG. 6E are diagrams each illustrating a transistor.

Although the display apparatus 100A illustrated in FIG. 1, FIG. 2A, or FIG. 2B has a stacked structure of the layer 11, the layer 12, the layer 13, and the layer 14, stacked structures illustrated in FIG. 6A and FIG. 6B may be employed.

FIG. 6A illustrates an example of a display apparatus 100B having a stacked structure of a layer 15, the layer 12, the layer 13, and the layer 14, and is different from the display apparatus 100A in that the layer 15 is provided instead of the layer 11. Note that components common to the layer 14 and the layer 11 are denoted by the same reference numerals.

Figure 7A:
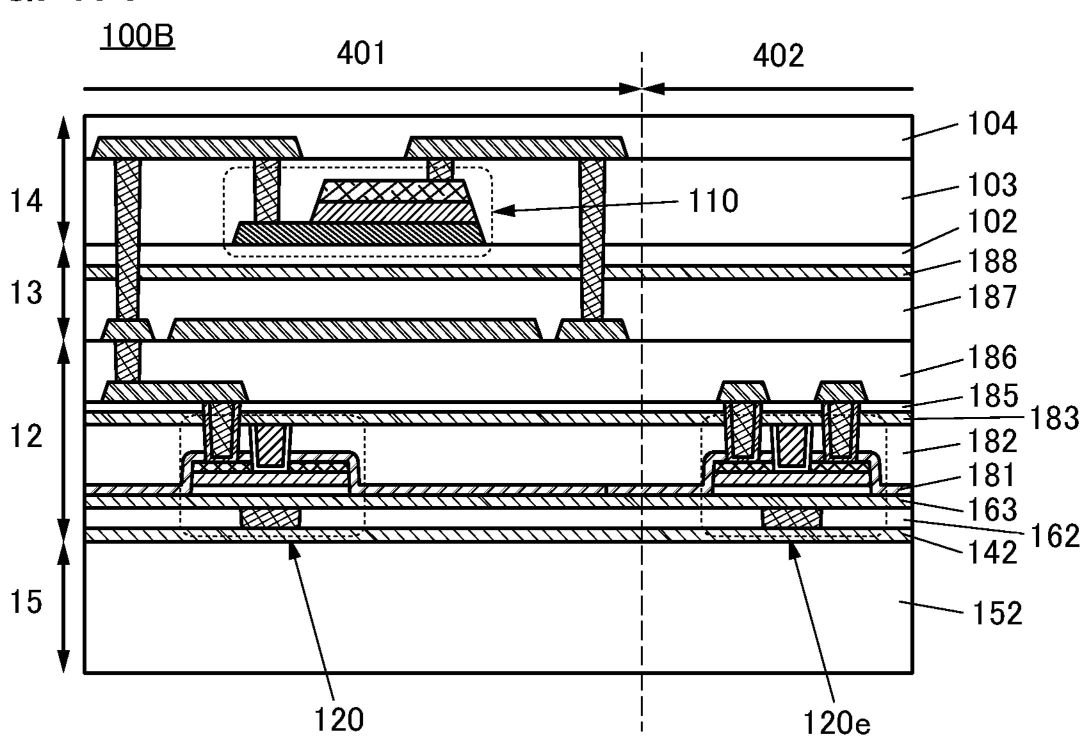
FIG. 7A and FIG. 7B are diagrams each illustrating a display apparatus.

Here, the layer 15 includes a substrate 152. The substrate 152 functions as a support substrate. For example, a semiconductor substrate of silicon or the like, a glass substrate, a ceramic substrate, a metal substrate, a resin substrate, or the like can be used as the substrate 152. In this structure, the driver circuit or the like of the pixel circuit can be formed using the OS transistors provided in the layer 12. For example, as illustrated in FIG. 7A, a transistor 120*e* included in the driver circuit of the pixel circuit can be provided in a region 402 provided outside a pixel portion 401.

Note that the structure of the transistor 120 included in the layer 12 is an example and a self-aligned transistor 120*c* illustrated in FIG. 6C may be employed. Alternatively, the layer 12 may include a staggered transistor, an inverted staggered transistor, a coplanar transistor, an inverted coplanar transistor, or the like. Any of the structures of these transistors can be applied to other display apparatuses described in this embodiment.

Figure 8A:
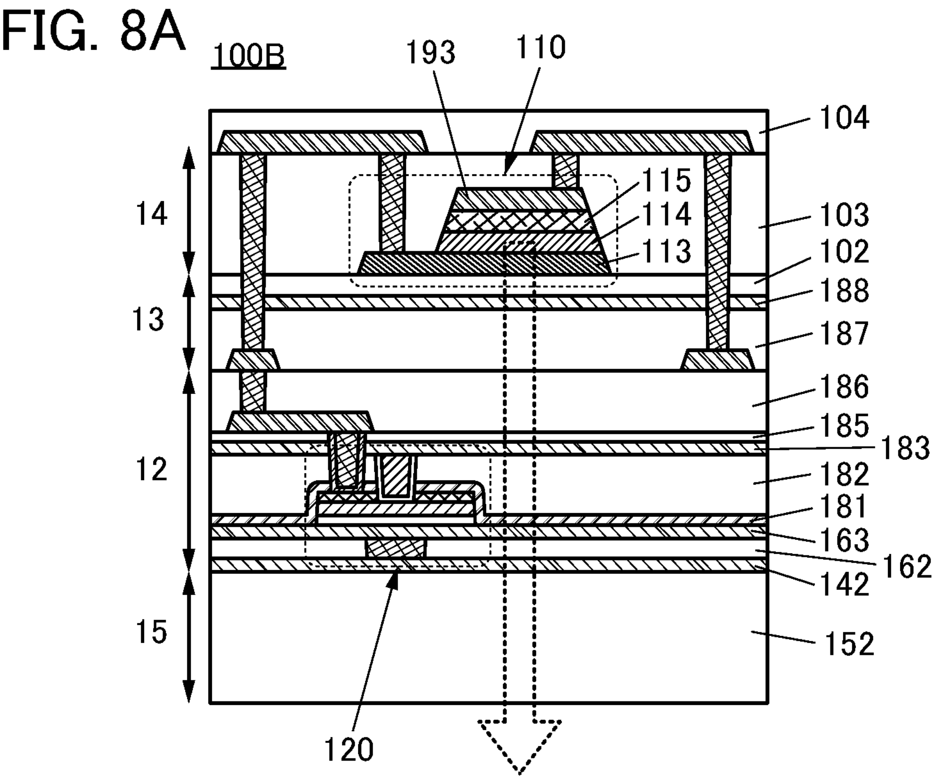
FIG. 8A and FIG. 8B are diagrams each illustrating a display apparatus.
Figure 8B:
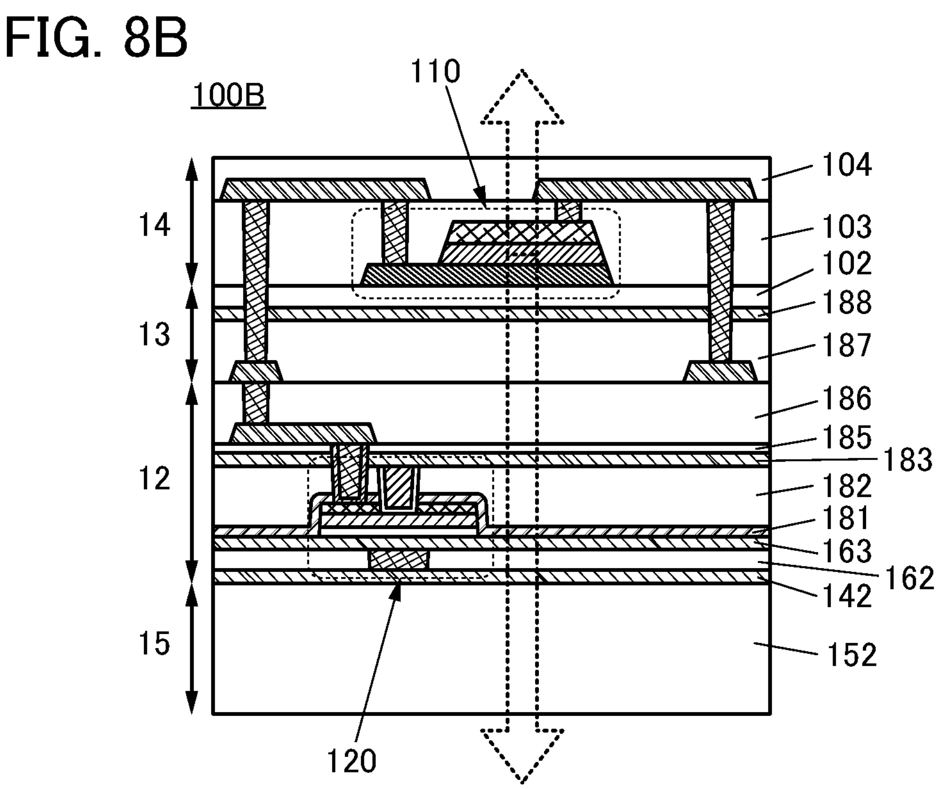

In the case where the substrate 152 has a property of transmitting light emitted from the light-emitting diode 110, light can be emitted to the outside through the substrate 152 by providing the reflective layer 193 over the semiconductor layer 115 as illustrated in FIG. 8A. Alternatively, as illustrated in FIG. 8B, the reflective layer 193 may be omitted and light may be emitted to both sides.

FIG. 6B illustrates an example of a display apparatus 100C having a stacked structure of a layer 16, the layer 12, the layer 13, and the layer 14, and is different from the display apparatus 100A in that the layer 16 is provided instead of the layer 11 and no OS transistor is provided in the layer 12. Note that components common to the layer 16 and the layer 11 are denoted by the same reference numerals.

Here, a pixel circuit (except for display devices) formed of Si transistors is provided in the layer 16. Accordingly, for example, a semiconductor substrate of silicon or the like can be used for the layer 16. FIG. 6B illustrates an example in which a transistor 130*d* is provided in a silicon substrate 153.

As illustrated in FIG. 6D, the layer 16 may include a self-aligned transistor 130*f* in which a silicon layer is provided over a substrate 154 with an insulating layer 143 therebetween and a channel formation region is formed in the silicon layer. For the silicon layer, single crystal silicon, polycrystalline silicon, microcrystalline silicon, amorphous silicon, or the like can be used. Alternatively, the layer 16 may include an inverted staggered transistor 130*g* illustrated in FIG. 6E. Further alternatively, the layer 16 may include a staggered transistor, a coplanar transistor, an inverted coplanar transistor, or the like. Any of the structures of these transistors can be applied for the layer 11 included in other display apparatuses described in this embodiment.

A silicon substrate, a glass substrate, a ceramic substrate, a metal substrate, a resin substrate, or the like can be used as the substrate 154. The insulating layer 143 is preferably formed using a single layer or a stack including one or more of inorganic insulating materials such as silicon oxide, silicon oxynitride, silicon nitride oxide, silicon nitride, aluminum oxide, hafnium oxide, and titanium nitride.

Figure 7B:
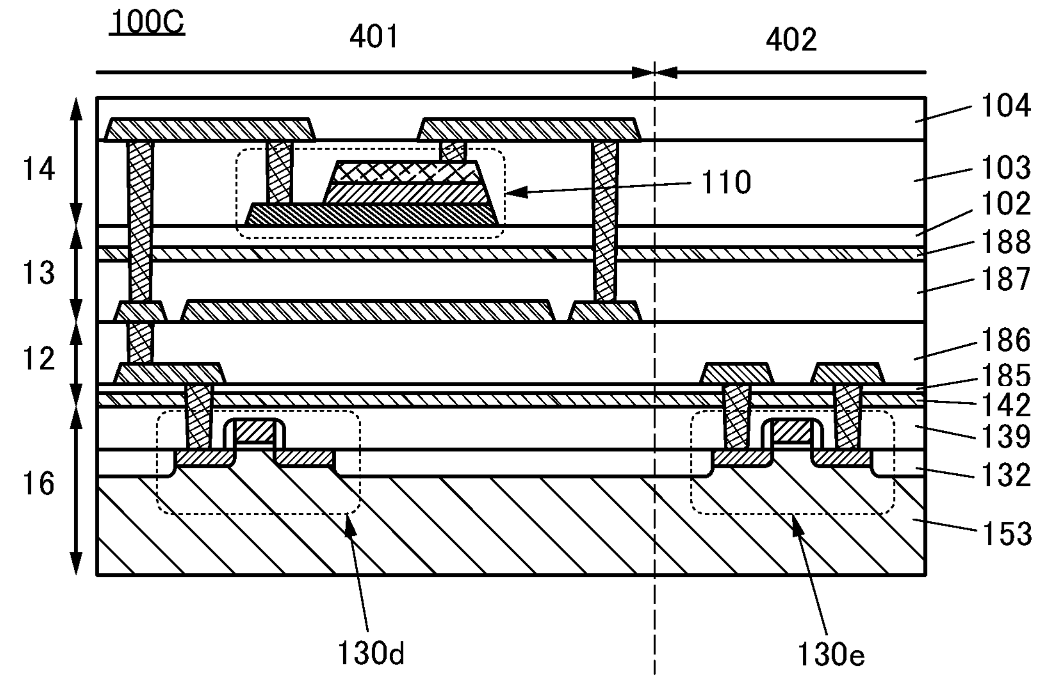

Note that the driver circuit or the like of the pixel circuit can be provided in the layer 16 in the display apparatus 100C. For example, as illustrated in FIG. 7B, a transistor 130*e* included in the driver circuit of the pixel circuit can be provided in the region 402 provided outside the pixel portion 401.

In the display apparatus 100B and the display apparatus 100C, part or the whole of the driver circuit of the pixel circuit may be provided in an external IC chip connected to the pixel circuit.

Figure 9:
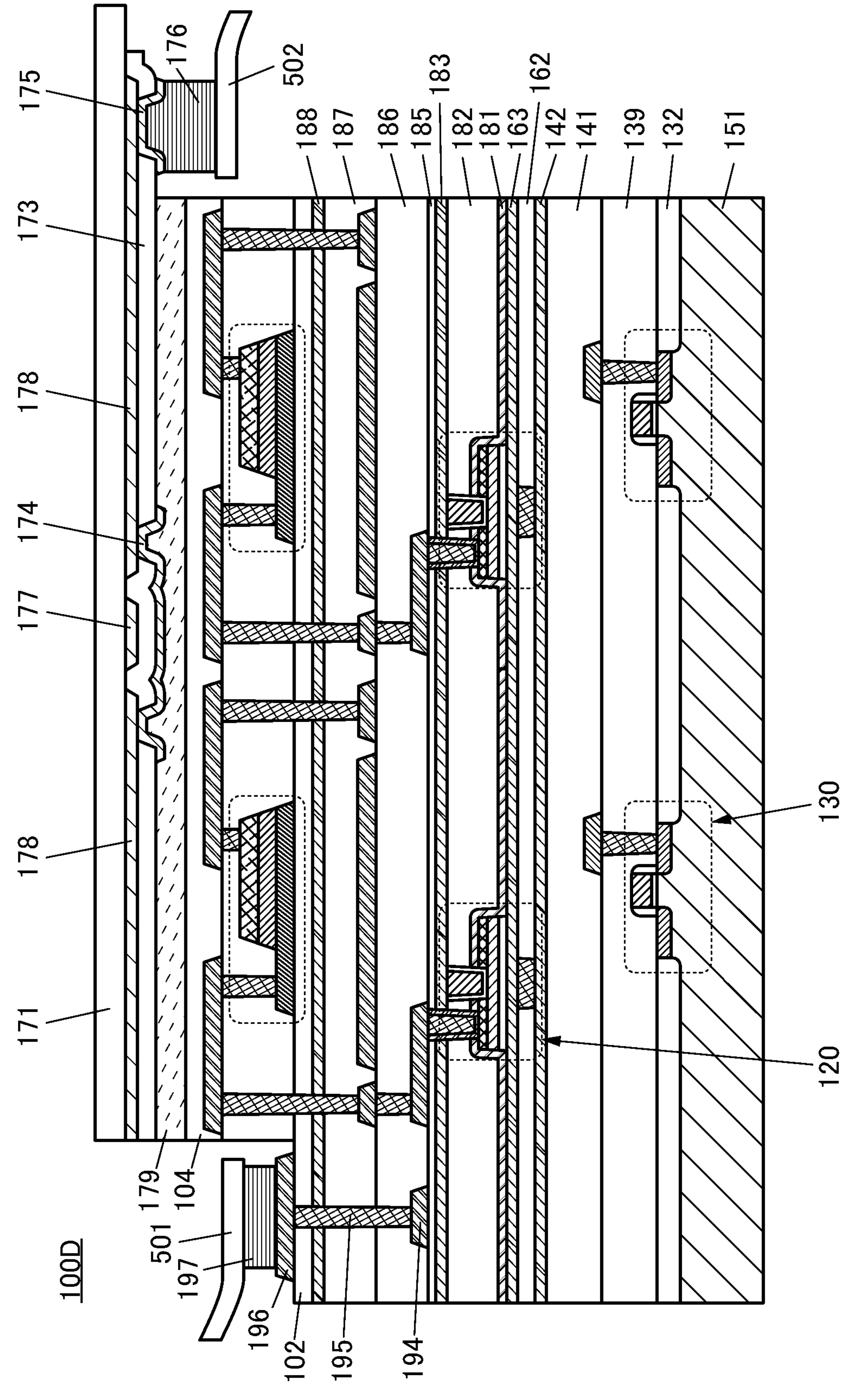
FIG. 9 is a diagram illustrating a display apparatus.

FIG. 9 is a cross-sectional view of a display apparatus 100D in which a display apparatus and a touch sensor are combined (such a display apparatus is also referred to as a touch panel). Although FIG. 9 illustrates the structure of the display apparatus 100A as an example, the display apparatus 100B or the display apparatus 100C can also be combined with a touch sensor.

There is no limitation on a detection device (also referred to as a sensor device, a detection element, or a sensor element) included in the touch panel of one embodiment of the present invention. A variety of sensors capable of detecting an approach or a contact of a sensing target such as a finger or a stylus can be used as the detection device.

For example, a variety of types such as a capacitive type, a resistive type, a surface acoustic wave type, an infrared type, an optical type, and a pressure-sensitive type can be used for the sensor.

In this embodiment, a touch panel including a capacitive detection device is described as an example.

Examples of the capacitive detection device include a surface capacitive detection device and a projected capacitive detection device. Examples of the projected capacitive detection device include a self-capacitive detection device and a mutual capacitive detection device. The use of a mutual capacitive detection device is preferred because multiple points can be sensed simultaneously.

The touch panel of one embodiment of the present invention can have any of a variety of structures, including a structure in which a display apparatus and a detection device that are separately formed are attached to each other and a structure in which an electrode and the like included in a detection device are provided on one or both of a substrate supporting a display apparatus and a counter substrate.

The conductive layer 194 is formed over the insulating layer 185. The conductive layer 194 functions as an electrode or a wiring for supplying power or a driving signal to the display apparatus 100A. The conductive layer 194 can be formed using the same material in the same step as the conductive layer 189, the conductive layer 192, the reflective layer 193, and the like.

The conductive layer 194 is electrically connected to an FPC (Flexible printed circuit) 501 through the conductive layer 195, a conductive layer 196, and a conductor 197. Power and a driving signal can be supplied to the display apparatus 100D through the FPC 501.

As the conductor 197, for example, an anisotropic conductive film (ACF) or an anisotropic conductive paste (ACP) can be used.

The touch sensor is provided on a first surface of a substrate 171. An adhesive layer 179 is provided to cover components of the touch sensor, and the adhesive layer 179 and the insulating layer 104 are attached to each other.

A conductive layer 177 and a conductive layer 178 are provided on the first surface of the substrate 171. The conductive layer 177 and the conductive layer 178 are formed on the same plane. A visible-light-transmitting material can be used for the conductive layer 177 and the conductive layer 178. An insulating layer 173 is provided to cover the conductive layer 177 and the conductive layer 178. A conductive layer 174 is electrically connected to two conductive layers 178 between which the conductive layer 177 is positioned, through opening portions provided in the insulating layer 173.

The conductive layer 178 is connected to a conductive layer 175. The conductive layer 175 can be formed using the same material in the same step as the conductive layer 174. The conductive layer 175 is electrically connected to an FPC 502 through a conductor 176. Like the conductor 197, the conductor 176 can be formed using an anisotropic conductive film or an anisotropic conductive paste.

As described above, in the display apparatus of this embodiment, a plurality of light-emitting diodes can be formed in the same step and electrical connections between the plurality of light-emitting diodes and a plurality of transistors can be made in the same step. Accordingly, reduction in manufacturing cost and improvement in yield of the display apparatus can be achieved. Moreover, a light-emitting diode included in a pixel circuit, a component such as a transistor included in the pixel circuit, and a component such as a transistor included in a driver circuit of the pixel circuit have an overlap region, whereby the display apparatus can be downsized.

This embodiment can be combined with the other embodiments as appropriate. In this specification, in the case where a plurality of structure examples are shown in one embodiment, the structure examples can be combined as appropriate.

Embodiment 2

In this embodiment, a structure is described in which a color conversion layer is provided on the side for emitting light of the light-emitting diode in the display apparatus described in Embodiment 1. Note that detailed description of the same components as those in Embodiment 1 is omitted.

Figure 10:
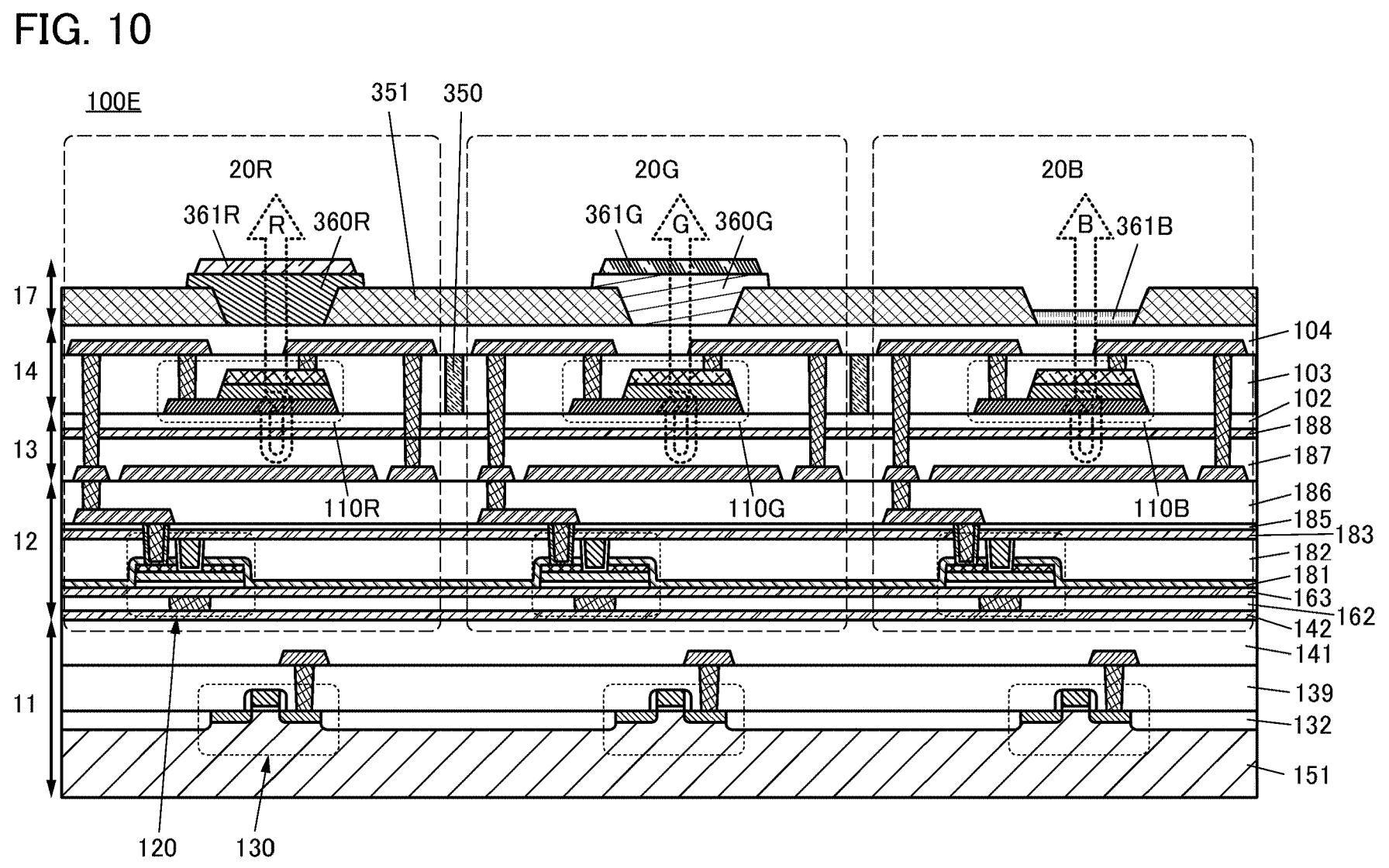

FIG. 10 is a cross-sectional view of a display apparatus 100E. The display apparatus 100E includes a pixel 20R emitting red light, a pixel 20G emitting green light, and a pixel 20B emitting blue light. A layer 17 is provided over the layer 14 in which the light-emitting diodes are provided. A color conversion layer, a coloring layer, a light-blocking layer, and the like are provided in the layer 17.

The pixel 20R includes a light-emitting diode 110R. The pixel 20G includes a light-emitting diode 110G. The pixel 20B includes a light-emitting diode 110B. The light-emitting diode 110R, the light-emitting diode 110G, and the light-emitting diode 110B emit light of the same color. That is, the light-emitting diode 110R, the light-emitting diode 110G, and the light-emitting diode 110B can have the same structure.

Specifically, the light-emitting diode 110R, the light-emitting diode 110G, and the light-emitting diode 110B preferably emit blue light. In order to create a color image, pixels emitting light of three primary colors of red (R), green (G), and blue (B) can be used. In the display apparatus described in this embodiment, a color conversion layer is used in a pixel, a color of light emitted from the light-emitting diode is changed into a needed color, and the light is emitted to the outside. Here, with a light-emitting diode emitting blue light, a color conversion layer is not needed in a pixel emitting blue light, and thus the manufacturing cost can be reduced.

A color conversion layer 360R and a coloring layer 361R are provided in a region overlapping with the light-emitting diode 110R in the red pixel 20R. Light emitted from the light-emitting diode 110R is converted from blue light into red light by the color conversion layer 360R, the purity of the red light is improved by the coloring layer 361R, and the red light is emitted to the outside of the display apparatus 100E. Note that the coloring layer 361R may be omitted.

A color conversion layer 360G and a coloring layer 361G are provided in a region overlapping with the light-emitting diode 110G in the green pixel 20G. Light emitted from the light-emitting diode 110G is converted from blue light into green light by the color conversion layer 360G, the purity of the green light is improved by the coloring layer 361G, and the green light is emitted to the outside of the display apparatus 100E. Note that the coloring layer 361G may be omitted.

A coloring layer 361B is provided in a region overlapping with the light-emitting diode 110B in the blue pixel 20B. The purity of blue light emitted from the light-emitting diode 110B is improved by the coloring layer 361B, and the blue light is emitted to the outside of the display apparatus 100E. Note that the coloring layer 361B may be omitted. As described above, a color conversion layer can be omitted in the blue pixel 20B.

In the display apparatus 100E, only light-emitting diodes of the same type need to be formed over a substrate; hence, a manufacturing apparatus and manufacturing process can be simplified compared to the case where a plurality of types of light-emitting diodes are formed.

A light-blocking layer 350 is provided between the pixels of respective colors. The light-blocking layer 350 is provided in a position in which at least light emitted from the light-emitting diode 110 in the lateral direction is blocked. The light-blocking layer 350 may be provided also in a position in which light emitted from the light-emitting diode 110 in the oblique direction is blocked, if needed. A light-blocking layer 351 covering the periphery of the pixels is provided over the insulating layer 104.

With the light-blocking layer 350 and the light-blocking layer 351, light emitted from the light-emitting diode can be prevented from entering an adjacent pixel region of another color, and color mixing can be prevented. Consequently, the display quality of the display apparatus can be improved. Note that either the light-blocking layer 350 or the light-blocking layer 351 may be provided.

There is no particular limitation on materials of the light-blocking layer 350 and the light-blocking layer 351; for example, an inorganic material such as a metal material or an organic material such as a resin material containing a pigment (e.g., carbon black) or dye can be used. The light-blocking layer 351 may be formed by stacking coloring layers of respective colors. For example, the light-blocking layer 351 can be formed by staking coloring layers of three colors of red, green, and blue.

The light-emitting diode 110R, the light-emitting diode 110G, and the light-emitting diode 110B may each emit light having a wavelength of a higher photon energy than that of blue light. For example, a light-emitting diode emitting bluish violet light, violet light, ultraviolet light, or the like can be used. With the use of light having a high photon energy, color conversion can be performed efficiently in the color conversion layer.

Figure 11:
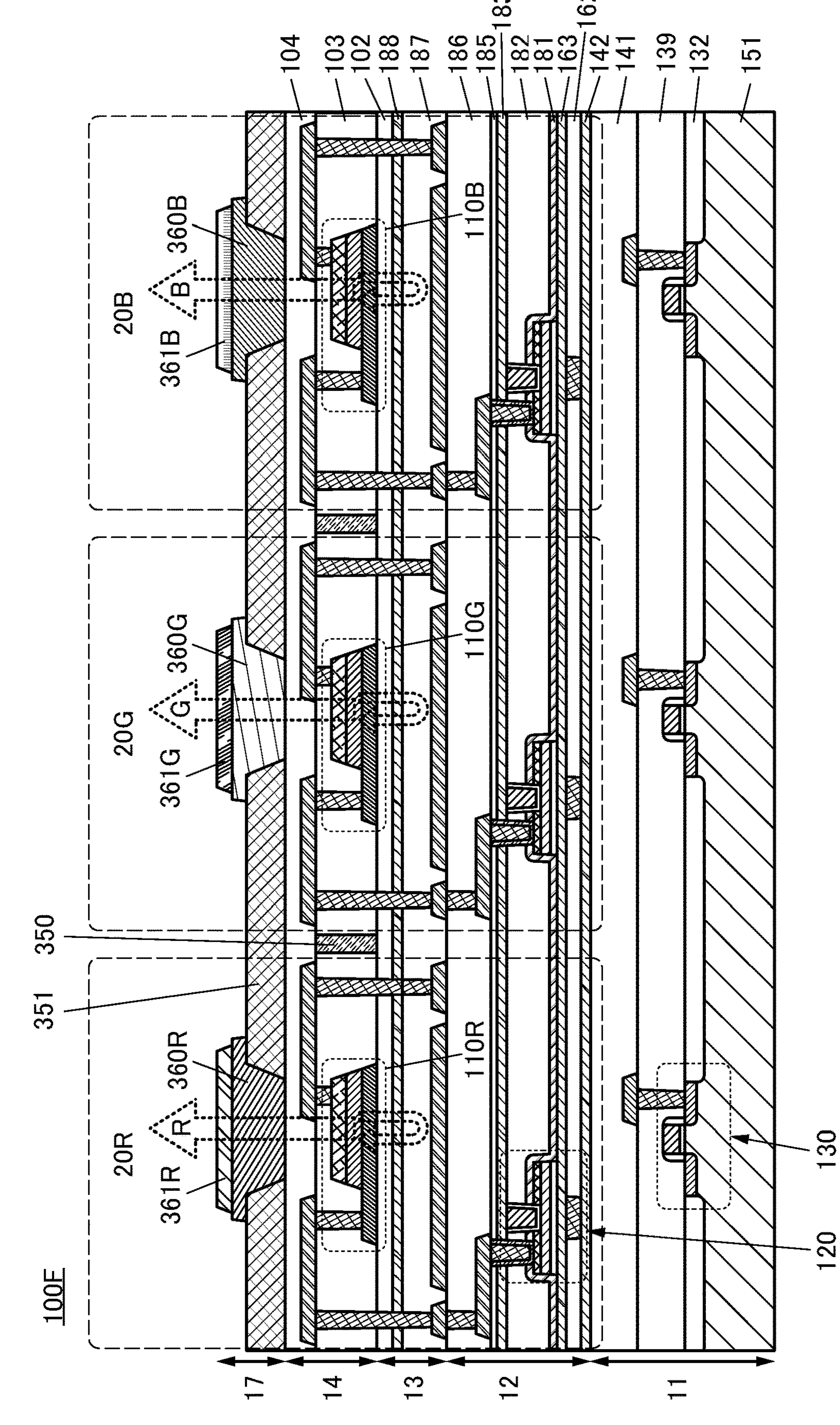
FIG. 11 is a diagram illustrating a display apparatus.

In this case, a color conversion layer 360B and a coloring layer 361B are provided in a region overlapping with the light-emitting diode 110B in the blue pixel 20B as in a display apparatus 100F illustrated in FIG. 11. Light emitted from the light-emitting diode 110B is converted to blue light from bluish violet light, violet light, or ultraviolet light by the color conversion layer 360B, the purity of the blue light is improved by the coloring layer 361B, and the blue light is emitted to the outside of the display apparatus 100E. Note that the coloring layer 361B may be omitted.

For the color conversion layer, a phosphor or a quantum dot (QD) is preferably used. In particular, a quantum dot has an emission spectrum with a narrow peak width, so that emission with high color purity can be obtained. Accordingly, the display quality of the display apparatus can be improved.

The color conversion layer can be formed by a droplet discharge method (e.g., an inkjet method), a coating method, an imprinting method, a variety of printing methods (screen printing or offset printing), or the like. A color conversion film such as a quantum dot film may also be used.

For processing a film to be the color conversion layer, a lithography method can be employed. For example, a method can be employed in which a resist mask is formed over a thin film that is to be processed, the thin film is processed by etching or the like, and then the resist mask is removed. Alternatively, another method may be employed in which after a photosensitive thin film is formed, exposure and development are performed to process the thin film into a desired shape. For example, a thin film is formed using a photosensitive material in which a quantum dot is mixed, and the thin film is processed by a lithography method, whereby an island-shaped color conversion layer can be formed.

There is no particular limitation on a material of a quantum dot, and examples include a Group 14 element, a Group 15 element, a Group 16 element, a compound of a plurality of Group 14 elements, a compound of an element belonging to any of Group 4 to Group 14 elements and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and a variety of semiconductor clusters.

Specific examples include cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot whose composition is represented by a given ratio may also be used.

Examples of the quantum dot include core-type quantum dots, core-shell quantum dots, and core-multishell quantum dots. Quantum dots have a high proportion of surface atoms and thus have high reactivity and easily aggregate together. For this reason, it is preferable that a protective agent be attached to, or a protective group be provided on the surfaces of quantum dots. The attachment of the protective agent or the provision of the protective group can prevent aggregation and increase solubility in a solvent. It can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size becomes smaller; thus, the emission wavelengths of the quantum dots can be adjusted over a wavelength range of a spectrum of an ultraviolet region, a visible light region, and an infrared region by changing the sizes of quantum dots. The size (diameter) of the quantum dot is, for example, greater than or equal to 0.5 nm and less than or equal to 20 nm, preferably greater than or equal to 1 nm and less than or equal to 10 nm. The emission spectra are narrowed as the size distribution of the quantum dots gets smaller, so that light with high color purity can be obtained. The shape of the quantum dot is not particularly limited and may be a spherical shape, a rod shape, a circular shape, or other shapes. Quantum rods, which are rod-shaped quantum dots, have a function of emitting directional light.

The coloring layer is a colored layer that transmits light in a specific wavelength range. For example, a color filter that transmits light in a red, green, blue, or yellow wavelength range can be used. Examples of a material that can be used for the coloring layer include a metal material, a resin material, and a resin material containing a pigment or a dye.

Note that although the structure of the display apparatus 100A is used for the display apparatus 100E and the display apparatus 100D as an example, any of the other display apparatuses described in Embodiment 1 can also be used.

This embodiment can be combined with the other embodiments as appropriate. In this specification, in the case where a plurality of structure examples are shown in one embodiment, the structure examples can be combined as appropriate.

Embodiment 3

In this embodiment, a transistor that can be used in the display apparatus of one embodiment of the present invention will be described.

There is no particular limitation on the structure of the transistor in the display apparatus. For example, a planar transistor, a staggered transistor, or an inverted staggered transistor may be used. A top-gate transistor or a bottom-gate transistor may be used. Gate electrodes may be provided above and below a channel.

As the transistor of the display apparatus, a transistor containing a metal oxide in a channel formation region can be used, for example. Therefore, a transistor with an extremely low off-state current can be obtained.

As the transistor of the display apparatus, a transistor containing silicon in a channel formation region may be used. Examples of the transistor include a transistor containing amorphous silicon, a transistor containing crystalline silicon (typically, low-temperature polysilicon), and a transistor containing single crystal silicon. For example, a transistor containing a metal oxide in a channel formation region and a transistor containing silicon in a channel formation region may be used in combination.

An insulator, a conductor, an oxide, or a semiconductor may be deposited by a sputtering method, a chemical vapor deposition (CVD) method, a molecular beam epitaxy (MBE) method, a pulsed laser deposition (PLD) method, an atomic layer deposition (ALD) method, or the like. In this specification and the like, the term "insulator" can be replaced with an insulating film or an insulating layer. The term "conductor" can be replaced with a conductive film or a conductive layer. The term "oxide" can be replaced with an oxide film or an oxide layer. The term "semiconductor" can be replaced with a semiconductor film or a semiconductor layer.

FIG. 12A is a top view of a transistor 200. Note that for simplification, some components are not illustrated in FIG. 12A. FIG. 12B is a cross-sectional view taken along a dashed-dotted line A1-A2 in FIG. 12A. FIG. 12B can be referred to as a cross-sectional view of the transistor 200 in the channel length direction. FIG. 12C is a cross-sectional view taken along a dashed-dotted line A3-A4 in FIG. 12A. FIG. 12C can be referred to as a cross-sectional view of the transistor 200 in the channel width direction. FIG. 12D is a cross-sectional view taken along a dashed-dotted line A5-A6 in FIG. 12A.

The semiconductor device illustrated in FIG. 12A to FIG. 12D includes, an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, and an insulator 285 over the insulator 283. The insulator 212, the insulator 214, the insulator 280, the insulator 282, the insulator 283, and the insulator 285 each function as an interlayer insulating film. The semiconductor device also includes a conductor 240 (a conductor 240*a* and a conductor 240*b*) that is electrically connected to the transistor 200 and functions as a plug. Note that an insulator 241 (an insulator 241*a* and an insulator 241*b*) is provided in contact with the side surface of the conductor 240 functioning as a plug. A conductor 246 (a conductor 246*a* and a conductor 246*b*) electrically connected to the conductor 240 and functioning as a wiring is provided over the insulator 285 and the conductor 240.

The insulator 241*a* is provided in contact with an inner wall of an opening formed in the insulator 280, the insulator 282, the insulator 283, and the insulator 285, a first conductor of the conductor 240*a* is provided in contact with the side surface of the insulator 241*a*, and a second conductor of the conductor 240*a* is provided on the inner side thereof. The insulator 241*b* is provided in contact with an inner wall of an opening formed in the insulator 280, the insulator 282, the insulator 283, and the insulator 285, a first conductor of the conductor 240*b* is provided in contact with the side surface of the insulator 241*b*, and a second conductor of the conductor 240*b* is provided on the inner side thereof. The top surface of the conductor 240 can be substantially level with the top surface of the insulator 285 in a region overlapping with the conductor 246. Although the first conductor and the second conductor are stacked as the conductor 240 in the transistor 200, the present invention is not limited thereto. For example, the conductor 240 may have a single-layer structure or a stacked-layer structure of three or more layers. In the case where a component has a stacked-layer structure, the layers may be distinguished by ordinal numbers corresponding to the formation order.

[Transistor 200]

As illustrated in FIG. 12A to FIG. 12D, the transistor 200 includes an insulator 216 over the insulator 214, a conductor 205 (a conductor 205*a* and a conductor 205*b*) provided to be embedded in the insulator 216, an insulator 222 over the insulator 216 and the conductor 205, an insulator 224 over the insulator 222, an oxide 230*a* over the insulator 224, an oxide 230*b* over the oxide 230*a*, an oxide 243 (an oxide 243*a* and an oxide 243*b*) over the oxide 230*b*, a conductor 242*a* over the oxide 243*a*, an insulator 271*a* over the conductor 242*a*, a conductor 242*b* over the oxide 243*b*, an insulator 271*b* over the conductor 242*b*, an insulator 250 (an insulator 250*a* and an insulator 250*b*) over the oxide 230*b*, a conductor 260 (a conductor 260*a* and a conductor 260*b*) provided over the insulator 250 and overlapping with part of the oxide 230*b*, and an insulator 275 provided to cover the insulator 222, the insulator 224, the oxide 230*a*, the oxide 230*b*, the oxide 243*a*, the oxide 243*b*, the conductor 242*a*, the conductor 242*b*, the insulator 271*a*, and insulator 271*b*.

Hereinafter, the oxide 230*a* and the oxide 230*b* are collectively referred to as an oxide 230 in some cases. The conductor 242*a* and the conductor 242*b* are collectively referred to as a conductor 242 in some cases. The insulator 271*a* and the insulator 271*b* are collectively referred to as an insulator 271 in some cases.

An opening reaching the oxide 230*b* is provided in the insulator 280 and the insulator 275. The insulator 250 and the conductor 260 are provided in the opening. In addition, in the channel length direction of the transistor 200, the conductor 260 and the insulator 250 are provided between the insulator 271*a*, the conductor 242*a*, and the oxide 243*a* and the insulator 271*b*, the conductor 242*b*, and the oxide 243*b*. The insulator 250 includes a region in contact with the side surface of the conductor 260 and a region in contact with the bottom surface of the conductor 260.

The oxide 230 preferably includes the oxide 230*a* provided over the insulator 224 and the oxide 230*b* provided over the oxide 230*a*. When the oxide 230*a* is provided under the oxide 230*b*, impurities can be inhibited from being diffused into the oxide 230*b* from the components formed below the oxide 230*a*.

Although the oxide 230 of the transistor 200 has a structure in which two layers, the oxide 230*a* and the oxide 230*b*, are stacked, the present invention is not limited to this structure. For example, the oxide 230 may have a single-layer structure of the oxide 230*b* or a stacked-layer structure of three or more layers, or the oxide 230*a* and the oxide 230*b* may each have a stacked-layer structure.

The conductor 260 functions as a first gate (also referred to as a top gate) electrode and the conductor 205 functions as a second gate (also referred to as a back gate) electrode. The insulator 250 functions as a first gate insulating film, and the insulator 224 and the insulator 222 function as a second gate insulating film. The conductor 242*a* functions as one of a source electrode and a drain electrode, and the conductor 242*b* functions as the other of the source electrode and the drain electrode. At least part of a region of the oxide 230 that overlaps with the conductor 260 functions as a channel formation region.

A region of the oxide 230*b* that overlaps with the conductor 242*a* includes one of a source region and a drain region, and a region of the oxide 230*b* that overlaps with the conductor 242*b* includes the other of the source region and the drain region. A region of the oxide 230*b* that is sandwiched between the source region and the drain region includes a channel formation region (a region indicated by a shaded portion in FIG. 12B).

The channel formation region has a smaller amount of oxygen vacancies or a lower impurity concentration than the source region and the drain region, and thus is a high-resistance region with a low carrier concentration. Here, the carrier concentration in the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. Note that the lower limit of the carrier concentration in the channel formation region is not particularly limited and can be, for example, $1\times10^{-9}$ $cm^{-3}$.

Although the channel formation region, the source region, and the drain region are formed in the oxide 230*b* in the above-described example, the present invention is not limited thereto. For example, a channel formation region, a source region, and a drain region are also formed in the oxide 230*a* in some cases.

In the transistor 200, the oxide 230 (the oxide 230*a* and the oxide 230*b*), which includes the channel formation region, is preferably formed using a metal oxide functioning as a semiconductor (also referred to as an oxide semiconductor).

The metal oxide functioning as a semiconductor preferably has a band gap of 2 eV or more, preferably 2.5 eV or more. The use of such a metal oxide having a wide band gap can reduce the off-state current of the transistor.

For example, for the oxide 230, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, an In—Ga oxide, an In—Zn oxide, or an indium oxide may be used for the oxide 230.

Here, the atomic ratio of In to the element Min the metal oxide used for the oxide 230*b* is preferably greater than the atomic ratio of In to the element Min the metal oxide used for the oxide 230*a*.

Specifically, for the oxide 230*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. For the oxide 230*b*, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the aforementioned atomic ratio is not limited to the atomic ratio of the deposited metal oxide and may be the atomic ratio of a sputtering target used for depositing the metal oxide.

When the oxide 230*a* is provided under the oxide 230*b* in the above manner, impurities and oxygen can be inhibited from diffusing into the oxide 230*b* from the components formed below the oxide 230*a*.

Furthermore, when the oxide 230*a* and the oxide 230*b* contain a common element (as the main component) besides oxygen, the density of defect states at the interface between the oxide 230*a* and the oxide 230*b* can be low. Since the density of defect states at the interface between the oxide 230*a* and the oxide 230*b* can be low, the influence of interface scattering on carrier conduction can be small and a high on-state current can be obtained.

The oxide 230*b* preferably has crystallinity. In particular, for the oxide 230*b*, a CAAC-OS (c-axis aligned crystalline oxide semiconductor) is preferably used.

The CAAC-OS is a metal oxide having a dense structure with high crystallinity and a small amount of impurities and defects (oxygen vacancy (Vo) or the like). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

By contrast, in the CAAC-OS, a reduction in electron mobility due to a grain boundary is less likely to occur because it is difficult to observe a clear grain boundary. Thus, a metal oxide including the CAAC-OS is physically stable. Accordingly, the metal oxide including the CAAC-OS is resistant to heat and has high reliability.

At least one of the insulator 212, the insulator 214, the insulator 271, the insulator 275, the insulator 282, and the insulator 283 preferably functions as a barrier insulating film that inhibits diffusion of impurities such as water and hydrogen from the substrate side or from above the transistor 200 into the transistor 200. Thus, for at least one of the insulator 212, the insulator 214, the insulator 271, the insulator 275, the insulator 282, and the insulator 283, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities do not easily pass) is preferably used. Alternatively, it is preferable to use an insulating material which has a function of inhibiting diffusion of oxygen (e.g., at least one of an oxygen atom, an oxygen molecule, and the like) (through which the above oxygen does not easily pass).

Note that in this specification, a barrier insulating film refers to an insulating film having a barrier property. A barrier property in this specification refers to a function of inhibiting diffusion of a particular substance (also referred to as a function of less easily transmitting the substance). Alternatively, a barrier property in this specification refers to a function of capturing and fixing (also referred to as gettering) a particular substance.

Aluminum oxide, magnesium oxide, hafnium oxide, gallium oxide, indium gallium zinc oxide, silicon nitride, or silicon nitride oxide can be used for the insulator 212, the insulator 214, the insulator 271, the insulator 275, the insulator 282, and the insulator 283, for example. For example, silicon nitride, which has a high hydrogen barrier property, is preferably used for the insulator 212, the insulator 275, and the insulator 283. For example, aluminum oxide, magnesium oxide, or the like, which has an excellent function of capturing and fixing hydrogen, is preferably used for the insulator 214, the insulator 271, and the insulator 282. Accordingly, impurities such as water and hydrogen can be inhibited from diffusing from the substrate side to the transistor 200 side through the insulator 212 and the insulator 214. Furthermore, impurities such as water and hydrogen can be inhibited from diffusing to the transistor 200 side from an interlayer insulating film and the like positioned outside the insulator 283. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to the components over the transistor 200 through the insulator 282 and the like. In this manner, the transistor 200 is preferably surrounded by the insulator 212, the insulator 214, the insulator 271, the insulator 275, the insulator 282, and the insulator 283, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, and the insulator 283. For example, a metal oxide such as $AlO_x$ (x is a given number larger than 0) or $MgO_y$ (y is a given number larger than 0) is preferably used. In such a metal oxide having an amorphous structure, oxygen atoms have dangling bonds, and the metal oxide has a property of capturing or fixing hydrogen with the dangling bonds in some cases. When such a metal oxide having an amorphous structure is used as the component of the transistor 200 or provided in the vicinity of the transistor 200, hydrogen contained in the transistor 200 or hydrogen in the vicinity of the transistor 200 can be captured or fixed. In particular, hydrogen contained in the channel formation region of the transistor 200 is preferably captured or fixed. The metal oxide having an amorphous structure is used as the component of the transistor 200 or provided in the vicinity of the transistor 200, whereby the transistor 200 and the semiconductor device with favorable characteristics and high reliability can be manufactured.

Although the insulator 212, the insulator 214, the insulator 271, the insulator 275, the insulator 282, and the insulator 283 preferably have an amorphous structure, they may include a region having a polycrystalline structure. Alternatively, the insulator 212, the insulator 214, the insulator 271, the insulator 275, the insulator 282, and the insulator 283 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 271, the insulator 275, the insulator 282, and the insulator 283 can be deposited by a sputtering method, for example. Since a sputtering method does not need to use hydrogen as a deposition gas, the hydrogen concentrations in the insulator 212, the insulator 214, the insulator 271, the insulator 275, the insulator 282, and the insulator 283 can be reduced. Note that the deposition method is not limited to a sputtering method, and a CVD method, an MBE method, a PLD method, an ALD method, or the like can be used as appropriate.

The dielectric constants of the insulator 216, the insulator 280, and the insulator 285 are preferably lower than the dielectric constant of the insulator 214. The use of a material having a low dielectric constant for the interlayer insulating film can reduce the parasitic capacitance between wirings. For example, for the insulator 216, the insulator 280, and the insulator 285, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The conductor 205 is provided to overlap with the oxide 230 and the conductor 260. Here, the conductor 205 is preferably provided to fill an opening formed in the insulator 216.

The conductor 205 includes the conductor **205*a* and the conductor 205*b*. The conductor 205*a* is provided in contact with the bottom surface and the side wall of the opening. The conductor 205*b* is provided so as to be embedded in a recessed portion formed in the conductor 205*a*. Here, the top surface of the conductor 205*b* is substantially level with the top surface of the conductor 205*a* and the top surface of the insulator 216**.

A conductive material that can be used for the conductor **260*a* described later may be used for the conductor 205*a*. A conductive material that can be used for the conductor 260*b* described later may be used for the conductor 205*b*. Although the conductor 205 of the transistor 200 has a structure in which the conductor 205*a* and the conductor 205*b* are stacked, the present invention is not limited to this structure. For example, the conductor 205** may have a single-layer structure or a stacked-layer structure of two layers or four or more layers.

The insulator 222 and the insulator 224 function as a gate insulating film.

The insulator 222 preferably has a function of inhibiting diffusion of hydrogen (e.g., at least one of a hydrogen atom, a hydrogen molecule, and the like). Moreover, the insulator 222 preferably has a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium, which is an insulating material, is preferably used. As the insulator, aluminum oxide, hafnium oxide, an oxide containing aluminum and hafnium (hafnium aluminate), or the like is preferably used. As the insulator 222, a barrier insulating film that can be used as the insulator 214 or the like may be used.

Silicon oxide, silicon oxynitride, or the like can be used as appropriate for the insulator 224. When the insulator 224 containing oxygen is provided in contact with the oxide 230, oxygen vacancies in the oxide 230 can be reduced, leading to an improvement in the reliability of the transistor 200. The insulator 224 is preferably processed into an island shape so as to overlap with the oxide 230*a*. In that case, the insulator 275 is in contact with the side surface of the insulator 224 and the top surface of the insulator 222. Accordingly, the insulator 224 and the insulator 280 can be apart from each other by the insulator 275; thus, diffusion of oxygen contained in the insulator 280 into the insulator 224 can be reduced, so that the amount of oxygen in the insulator 224 can be prevented from being excessively large.

Note that the insulator 222 and the insulator 224 may each have a stacked-layer structure of two or more layers. In that case, the stacked layers are not necessarily formed of the same material and may be formed of different materials. Note that FIG. 12B and the like illustrate the structure in which the insulator 224 is formed into an island shape so as to overlap with the oxide 230*a*; however, the present invention is not limited to this structure. In the case where the amount of oxygen contained in the insulator 224 can be adjusted appropriately, a structure in which the insulator 224 is not pattered in a manner similar to that of the insulator 222 may be employed.

The oxide 243*a* and the oxide 243*b* are provided over the oxide 230*b*. The oxide 243*a* and the oxide 243*b* are provided to be apart from each other with the conductor 260 therebetween. The oxide 243 (the oxide 243*a* and the oxide 243*b*) preferably has a function of inhibiting oxygen transmission. It is preferable that the oxide 243 having a function of inhibiting oxygen transmission be provided between the oxide 230*b* and the conductor 242 functioning as the source electrode or the drain electrode, in which case the electrical resistance between the oxide 230*b* and the conductor 242 is reduced. In the case where the electrical resistance between the oxide 230*b* and the conductor 242 can be sufficiently reduced, the oxide 243 is not necessarily provided.

A metal oxide containing the element M may be used for the oxide 243. In particular, aluminum, gallium, yttrium, or tin is preferably used as the element M. The concentration of the element M in the oxide 243 is preferably higher than that in the oxide 230*b*. Alternatively, gallium oxide may be used for the oxide 243. A metal oxide such as an In-M-Zn oxide may be used for the oxide 243. Specifically, the atomic ratio of the element M to In in the metal oxide used for the oxide 243 is preferably higher than the atomic ratio of the element M to In in the metal oxide used for the oxide 230*b*. The thickness of the oxide 243 is preferably greater than or equal to 0.5 nm and less than or equal to 5 nm, further preferably greater than or equal to 1 nm and less than or equal to 3 nm, still further preferably greater than or equal to 1 nm and less than or equal to 2 nm.

It is preferable that the conductor 242*a* be provided in contact with the top surface of the oxide 243*a* and the conductor 242*b* be provided in contact with the top surface of the oxide 243*b*. The conductor 242*a* and the conductor 242*b* function as the source electrode and the drain electrode of the transistor 200.

For the conductor 242 (the conductor 242*a* and the conductor 242*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 12D. Accordingly, the conductivity of the conductor 242 is increased, so that the on-state current of the transistor 200 can be increased.

The insulator 271*a* is provided in contact with the top surface of the conductor 242*a*, and the insulator 271*b* is provided in contact with the top surface of the conductor 242*b*.

The insulator 275 is provided in contact with the top surface of the insulator 222, the side surface of the insulator 224, the side surface of the oxide 230*a*, the side surface of the oxide 230*b*, the side surface of the oxide 243, the side surface of the conductor 242, and the side surface and the top surface of the insulator 271. An opening is provided in a region of the insulator 275 where the insulator 250 and the conductor 260 are provided.

The insulator 214, the insulator 271, and the insulator 275 having a function of capturing impurities such as hydrogen are provided in a region sandwiched between the insulator 212 and the insulator 275, whereby impurities such as hydrogen contained in the insulator 224, the insulator 216, or the like can be captured, and the amount of hydrogen in the region can be kept constant. In that case, the insulator 214, the insulator 271, and the insulator 275 preferably contain amorphous-structured aluminum oxide.

The insulator 250 includes the insulator 250*a* and the insulator 250*b* over the insulator 250*a* and functions as a gate insulating film. It is preferable that the insulator 250*a* be provided in contact with the top surface of the oxide 230*b*, the side surface of the oxide 243, the side surface of the conductor 242, the side surface of the insulator 271, the side surface of the insulator 275, and the side surface of the insulator 280. The thickness of the insulator 250 is preferably greater than or equal to 1 nm and less than or equal to 20 nm.

For the insulator 250*a*, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable. As in the insulator 224, the concentration of impurities such as water, hydrogen, and the like in the insulator 250*a* is preferably reduced.

It is preferable that the insulator 250*a* be formed using an insulator from which oxygen is released by heating and the insulator 250*b* be formed using an insulator having a function of inhibiting diffusion of oxygen. Owing to this structure, diffusion of oxygen contained in the insulator 250*a* into the conductor 260 can be inhibited. That is, a reduction in the amount of oxygen supplied to the oxide 230 can be inhibited. Moreover, oxidation of the conductor 260 due to oxygen contained in the insulator 250*a* can be inhibited. For example, the insulator 250*b* can be formed using a material similar to that used for the insulator 222.

Specifically, for the insulator 250*b*, a metal oxide containing one or more kinds selected from hafnium, aluminum, gallium, yttrium, zirconium, tungsten, titanium, tantalum, nickel, germanium, magnesium, and the like or a metal oxide that can be used for the oxide 230 can be used. In particular, an insulator containing an oxide of one or both of aluminum and hafnium is preferably used. As the insulator, aluminum oxide, hafnium oxide, an oxide containing aluminum and hafnium (hafnium aluminate), or the like is preferably used. The thickness of the insulator 250*b* is preferably greater than or equal to 0.5 nm and less than or equal to 3.0 nm, further preferably greater than or equal to 1.0 nm and less than or equal to 1.5 nm.

Although FIG. 12B and FIG. 12C show that the insulator 250 has the stacked-layer structure of two layers, the present invention is not limited thereto. The insulator 250 may have a single-layer structure or a stacked-layer structure of three or more layers.

The conductor 260 is provided over the insulator 250*b* and functions as a first gate electrode of the transistor 200. The conductor 260 preferably includes the conductor 260*a* and the conductor 260*b* over the conductor 260*a*. For example, the conductor 260*a* is preferably positioned so as to cover the bottom surface and the side surface of the conductor 260*b*. As illustrated in FIG. 12B and FIG. 12C, the top surface of the conductor 260 is substantially aligned with the top surface of the insulator 250. Although FIG. 12B and FIG. 12C show that the conductor 260 has the two-layer structure of the conductor 260*a* and the conductor 260*b*, the conductor 260 may have a single-layer structure or a stacked-layer structure of three or more layers.

The conductor 260*a* is preferably formed using a conductive material having a function of inhibiting diffusion of impurities such as hydrogen atoms, hydrogen molecules, water molecules, nitrogen atoms, nitrogen molecules, nitrogen oxide molecules, and copper atoms. Alternatively, the conductor 260*a* is preferably formed using a conductive material having a function of inhibiting diffusion of oxygen (e.g., at least one of an oxygen atom and an oxygen molecule).

When the conductor 260*a* has a function of inhibiting diffusion of oxygen, the conductivity of the conductor 260*b* can be prevented from being lowered because of oxidization of the conductor 260*b* due to oxygen in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260*b*. The conductor 260*b* may have a stacked-layer structure, for example, a stacked-layer structure of titanium or titanium nitride and the above conductive material.

In the transistor 200, the conductor 260 is formed in a self-aligned manner so as to fill an opening formed in the insulator 280 and the like. Being formed in this manner, the conductor 260 can surely be provided in a region between the conductor 242*a* and the conductor 242*b* without alignment.

In the channel width direction of the transistor 200 as illustrated in FIG. 12C, with the level of the bottom surface of the insulator 222 as a reference, the level of a region of the bottom surface of the conductor 260 that does not overlap with the oxide 230*b* is preferably lower than the level of the bottom surface of the oxide 230*b*. When the conductor 260 functioning as the gate electrode covers the side surface and the top surface of the channel formation region of the oxide 230*b* with the insulator 250 and the like therebetween, the electric field of the conductor 260 is likely to affect the entire channel formation region in the oxide 230*b*. Hence, the transistor 200 can have a higher on-state current and higher frequency characteristics. With the level of the bottom surface of the insulator 222 as a reference, the difference between the bottom surface of the conductor 260 and the bottom surface of the oxide 230*b* in a region where the conductor 260 does not overlap with the oxide 230*a* and the oxide 230*b* is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 280 is provided over the insulator 275, and the opening is formed in the region where the insulator 250 and the conductor 260 are provided. The top surface of the insulator 280 may be planarized. In that case, the top surface of the insulator 280 is preferably aligned with the top surface of the insulator 250 and the top surface of the conductor 260.

The insulator 282 is provided in contact with the top surface of the insulator 280, the top surface of the insulator 250, and the top surface of the conductor 260. The insulator 282 preferably functions as a barrier insulating film that inhibits impurities such as water and hydrogen from diffusing into the insulator 280 from the above and preferably has a function of capturing impurities such as hydrogen. The insulator 282 also preferably functions as a barrier insulating film that inhibits oxygen transmission. For the insulator 282, for example, an insulator such as aluminum oxide can be used. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be kept constant. It is particularly preferable to use aluminum oxide having an amorphous structure or amorphous-structured aluminum oxide for the insulator 282 because hydrogen can be captured or fixed more effectively in some cases. Accordingly, the transistor 200 and the semiconductor device with favorable characteristics and high reliability can be manufactured.

The conductor 240*a* and the conductor 240*b* are preferably formed using a conductive material containing tungsten, copper, or aluminum as its main component. The conductor 240*a* and the conductor 240*b* may have a stacked-layer structure. In the case where the conductor 240 has a stacked-layer structure, the conductor in contact with the insulator 241 is preferably formed using a conductive material having a function of inhibiting transmission of impurities such as water and hydrogen. For example, any of the above conductive materials that can be used for the conductor 260*a* may be used.

An insulator such as silicon nitride, aluminum oxide, or silicon nitride oxide may be used for the insulator 241*a* and the insulator 241*b*, for example. Since the insulator 241*a* and the insulator 241*b* are provided in contact with the insulator 283, the insulator 282, and the insulator 271, impurities such as water and hydrogen contained in the insulator 280 and the like can be prevented from entering the oxide 230 through the conductor 240*a* and the conductor 240*b*.

The conductor 246 (the conductor 246*a* and the conductor 246*b*) functioning as a wiring may be provided in contact with the top surface of the conductor 240*a* and the top surface of the conductor 240*b*. The conductor 246 is preferably formed using a conductive material containing tungsten, copper, or aluminum as its main component. The conductor may have a stacked-layer structure, for example, a stack of titanium or titanium nitride and the above conductive material. Note that the conductor may be formed to be embedded in an opening in an insulator.

In the above manner, a semiconductor device having favorable electrical characteristics can be provided. A highly reliable semiconductor device can also be provided. A semiconductor device that can be miniaturized or highly integrated can be provided. Alternatively, a semiconductor device with low power consumption can be provided.

[Metal Oxide]

Next, a metal oxide (also referred to as an oxide semiconductor) that can be used for the transistor will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as a metal organic chemical vapor deposition (MOCVD) method, an ALD method, or the like.

<Classification of Crystal Structure>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be analyzed with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as “amorphous” unless it has a bilaterally symmetrical peak in the XRD spectrum.

The crystal structure of a film or a substrate can be analyzed with a diffraction pattern obtained by nano beam electron diffraction (NBED) (also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is presumed that the IGZO film deposited at room temperature is in an intermediate state, which is neither a crystal state nor an amorphous state, and it cannot be concluded that the IGZO film is in an amorphous state.

<<Oxide Semiconductor Structure>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[[CAAC-OS]]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a plurality of fine crystals, the size of the crystal region may be approximately several tens of nanometers.

Furthermore, in an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, In layer) and a layer containing the element M, zinc (Zn), and oxygen (hereinafter, (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at or around $2\theta=31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, and the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[[nc-OS]]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using $\theta/2\theta$ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[[a-like OS]]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Oxide Semiconductor Structure>>

Next, the CAC-OS will be described in detail. Note that the CAC-OS relates to the material composition.

[[CAC-OS]]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. In addition, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility (μ), and favorable switching operation can be achieved.

A transistor using a CAC-OS is highly reliable. Thus, the CAC-OS is suitably used in a variety of semiconductor devices typified by a display apparatus.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

This embodiment can be combined with any of the other embodiments as appropriate.

Embodiment 4

In this embodiment, a display apparatus of one embodiment of the present invention will be described with reference to FIG. 13.

A display apparatus of this embodiment includes a plurality of pixels arranged in a matrix of m rows and n columns (m and n are each an integer of 1 or more). FIG. 13 shows an example of a circuit diagram of a pixel PIX(i,j) (i is an integer of 1 or more and m or less, and j is an integer of 1 or more and n or less).

Figure 13:
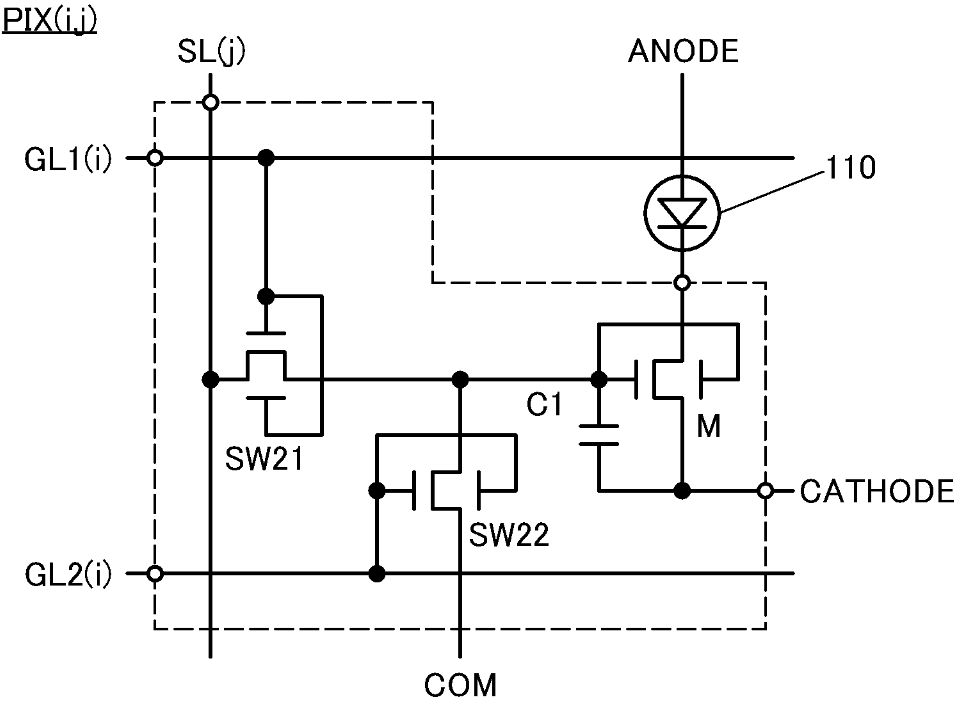
FIG. 13 is a circuit diagram illustrating an example of a pixel circuit.

The pixel PIX(i,j) in FIG. 13 includes the light-emitting diode 110 described in Embodiment 1, a switch SW21, a transistor M, and a capacitor C1. The transistor M corresponds to the transistor 120 or the transistor 130*d* described in Embodiment 1. The pixel PIX(i,j) may further include a switch SW22. The light-emitting diode 110 is preferably a micro light-emitting diode or a mini light-emitting diode.

In this embodiment, a transistor is used as the switch SW21. A gate of the switch SW21 is electrically connected to a scan line GL1(*i*). One of a source and a drain of the switch SW21 is electrically connected to a signal line SL(j) and the other of the source and the drain is electrically connected to a gate of the transistor M.

In this embodiment, a transistor is used as the switch SW22. A gate of the switch SW22 is electrically connected to a scan line GL2(*i*). One of a source and a drain of the switch SW22 is electrically connected to a wiring COM and the other of the source and the drain is electrically connected to the gate of the transistor M.

The gate of the transistor M is electrically connected to one electrode of the capacitor C1, the other of the source and the drain of the switch SW21, and the other of the source and the drain of the switch SW22. One of a source and a drain of the transistor M is electrically connected to a wiring CATHODE and the other of the source and the drain is electrically connected to a cathode of the light-emitting diode 110.

The other electrode of the capacitor C1 is electrically connected to the wiring CATHODE.

An anode of the light-emitting diode 110 is electrically connected to a wiring ANODE.

The scan line GL1(*i*) has a function of supplying a selection signal. The scan line GL2(*i*) has a function of supplying a control signal. The signal line SL(j) has a function of supplying an image signal. A constant potential is supplied to each of the wiring COM, the wiring CATHODE, and the wiring ANODE. In the light-emitting diode 110, the anode side can have a high potential and the cathode side can have a lower potential than the anode side.

The switch SW21 is controlled by a selection signal and functions as a selection transistor for controlling the selection state of the pixel PIX(i,j).

The transistor M functions as a driving transistor that controls a current flowing through the light-emitting diode 110 in accordance with a potential supplied to the gate. When the switch SW21 is on, an image signal supplied to the signal line SL(j) is supplied to the gate of the transistor M, and the luminance of the light-emitting diode 110 can be controlled in accordance with the potential of the image signal.

The switch SW22 has a function of controlling the gate potential of the transistor M on the basis of a control signal. Specifically, the switch SW22 can supply a potential for turning off the transistor M to the gate of the transistor M.

The switch SW22 can be used to control the pulse width, for example. During a period based on a control signal, a current can be supplied from the transistor M to the light-emitting diode 110. The light-emitting diode 110 can express gray levels on the basis of an image signal and a control signal.

Here, as each of the transistors included in the pixel PIX(i,j), it is preferable to use a transistor including a metal oxide (an oxide semiconductor) for a semiconductor layer where a channel is formed.

A transistor including a metal oxide which has a wider band gap and a lower carrier density than silicon has an extremely low off-state current. Therefore, owing to the low off-state current, a charge accumulated in a capacitor that is series-connected to the transistor can be retained for a long time. Thus, in particular, a transistor including an oxide semiconductor is preferably used as each of the switches SW21 and SW22 series-connected to the capacitor C1. Moreover, the use of transistors using an oxide semiconductor as the other transistors can reduce the manufacturing cost.

Alternatively, a transistor including silicon as a semiconductor in which a channel is formed can be used as the transistor included in the pixel PIX(i,j). In particular, the use of silicon with high crystallinity, such as single crystal silicon or polycrystalline silicon, is preferable because high field-effect mobility is achieved and higher-speed operation is possible.

Alternatively, a structure may be employed in which a transistor including an oxide semiconductor is used as one or more of the transistors included in the pixel PIX(i,j), and a transistor including silicon is used as the other transistor(s).

Although n-channel transistors are shown as the transistors in FIG. 13, p-channel transistors can be used as appropriate.

This embodiment can be combined with any of the other embodiments as appropriate.

Embodiment 5

In this embodiment, electronic devices of embodiments of the present invention will be described with reference to FIG. 14 to FIG. 19.

Electronic devices of this embodiment are each provided with the display apparatus of one embodiment of the present invention in a display portion. The display apparatus of one embodiment of the present invention has high display quality and low power consumption. In addition, the resolution and the definition of the display apparatus of one embodiment of the present invention can be easily increased. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display apparatus of one embodiment of the present invention can have a high resolution, and thus can be suitably used for an electronic device including a relatively small display portion. Examples of such an electronic device include a watch-type or bracelet-type information terminal device (a wearable device), a VR device such as a head mounted display, a glasses-type AR device, an MR device, an XR device, and a wearable device worn on a head.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 3000 ppi, still further preferably higher than or equal to 5000 ppi, yet further preferably higher than or equal to 7000 ppi. With the display apparatus with such high definition, the electronic device can have higher realistic sensation, sense of depth, or the like in personal use such as portable use or home use.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device of this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 14A:
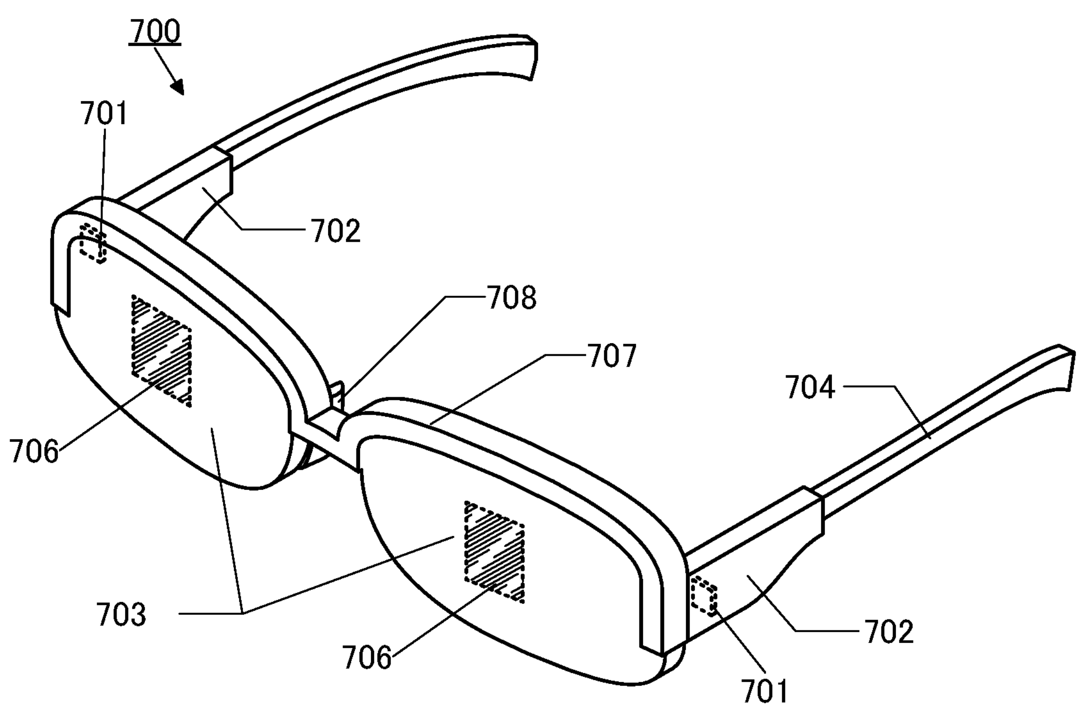
FIG. 14A and FIG. 14B are diagrams illustrating an example of an electronic device.

FIG. 14A is a perspective view of a glasses-type electronic device 700. The electronic device 700 includes a pair of display panels 701, a pair of housings 702, a pair of optical members 703, a pair of temples 704, a frame 707, a nose pad 708, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One or each of the housings 702 may be provided with a camera capable of taking what lies in front thereof. The housing 702 may have a wireless communication device, and a video signal or the like can be supplied to the housing 702 by the wireless communication device. Instead of or in addition to the wireless communication device, a connector to which a cable for supplying a video signal or a power potential can be connected may be provided. Furthermore, when the housing 702 is provided with an acceleration sensor such as a gyroscope sensor, the orientation of the user's head can be detected and an image corresponding to the orientation can be displayed on the display region 706.

One or each of the housings 702 may be provided with a processor. The processor has a function of controlling the components of the electronic device 700, such as the camera, the wireless communication device, and the pair of display panels 701, a function of generating an image, and the like. The processor may have a function of generating a composite image for AR display.

Data communication with an external device can be performed by the wireless communication device. For example, data that is transmitted from the outside is output to the processor, and the processor can generate image data for AR display on the basis of the data. Examples of the data transmitted from the outside include image data and data having biological information transmitted from a biological sensor device or the like.

A method for projecting an image on the display region 706 of the electronic device 700 is described with reference to FIG. 14B. The display panel 701 is provided inside the housing 702. A reflective plate 712 is provided in the optical member 703, and a reflective surface 713 functioning as a half mirror is provided in a portion corresponding to the display region 706 of the optical member 703.

Light 715 emitted from the display panel 701 is reflected by the reflective plate 712 toward the optical member 703. In the optical member 703, the light 715 is fully reflected repeatedly by surfaces of an edge portion of the optical member 703 and reaches the reflective surface 713, whereby an image is projected on the reflective surface 713. Accordingly, the user can see both the light 715 reflected by the reflective surface 713 and transmitted light 716 that passes through the optical member 703 (including the reflective surface 713).

Figure 14B:
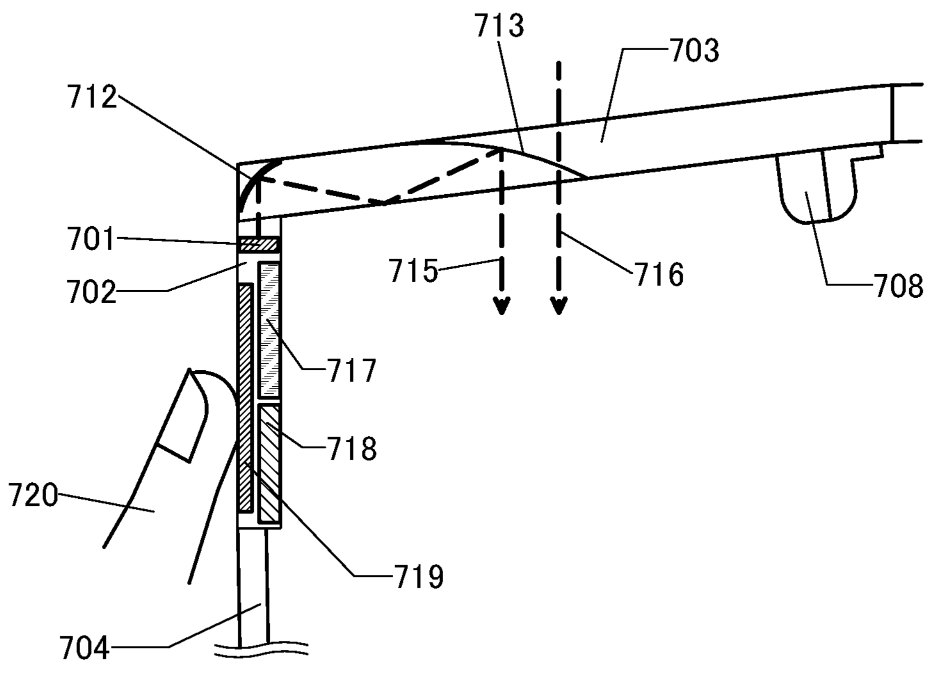

FIG. 14B shows an example in which the reflective plate 712 and the reflective surface 713 each have a curved surface. This structure can increase optical design flexibility and reduce the thickness of the optical member 703, compared to the case where the reflective plate 712 and the reflective surface 713 are flat. Note that the reflective plate 712 and the reflective surface 713 may be flat.

The reflective plate 712 can be a component having a mirror surface and preferably has high reflectivity. As the reflective surface 713, a half mirror utilizing reflection of a metal film may be used, but the use of a total-reflection prism or the like can increase the transmittance of the transmitted light 716.

Here, the housing 702 may include a lens between the display panel 701 and the reflective plate 712. Here, the housing 702 preferably includes a mechanism for adjusting the distance and angle between the lens and the display panel 701, in which case the focus can be adjusted and images can be zoomed in and out. One or both of the lens and the display panel 701 are preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the optimum position in accordance with the position of the user's eye.

The housing 702 is preferably provided with a battery 717 and a wireless power supply module 718. With the battery 717, the electronic device 700 can be used without being connected to another battery, leading to high convenience. In addition, with the wireless power supply module 718, power can be charged wirelessly, leading to high convenience and high design property. Furthermore, a risk of failure such as contact failure can be reduced as compared to the case of charging with a wire such as a connector, so that the reliability of the electronic device 700 can be increased.

A touch sensor module 719 is provided in the housing 702. The touch sensor module 719 has a function of detecting a touch on the outer surface of the housing 702. FIG. 14B illustrates a state where the surface of the housing 702 is touched with a finger 720. A tap operation or a slide operation, for example, by the user can be detected with the touch sensor module 719, whereby a variety of processing can be executed. For example, processing such as a pause and a restart of a moving image can be executed by a tap operation, and processing such as fast forward and fast rewind can be executed by a slide operation. The touch sensor module 719 is provided in each of the two housings 702, whereby the range of the operation can be increased.

Various touch sensors can be applied to the touch sensor module 719. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module 719.

In the case of using an optical touch sensor, a photoelectric conversion device (also referred to as a photoelectric conversion element) can be used as a light-receiving device (also referred to as a light-receiving element). Examples of the photoelectric conversion device include a photoelectric conversion device in which an inorganic semiconductor or an organic semiconductor is used in an active layer.

The display apparatus of one embodiment of the present invention can be used for the display panel 701. Thus, the electronic device 700 can perform display with extremely high resolution.

Figure 15A:
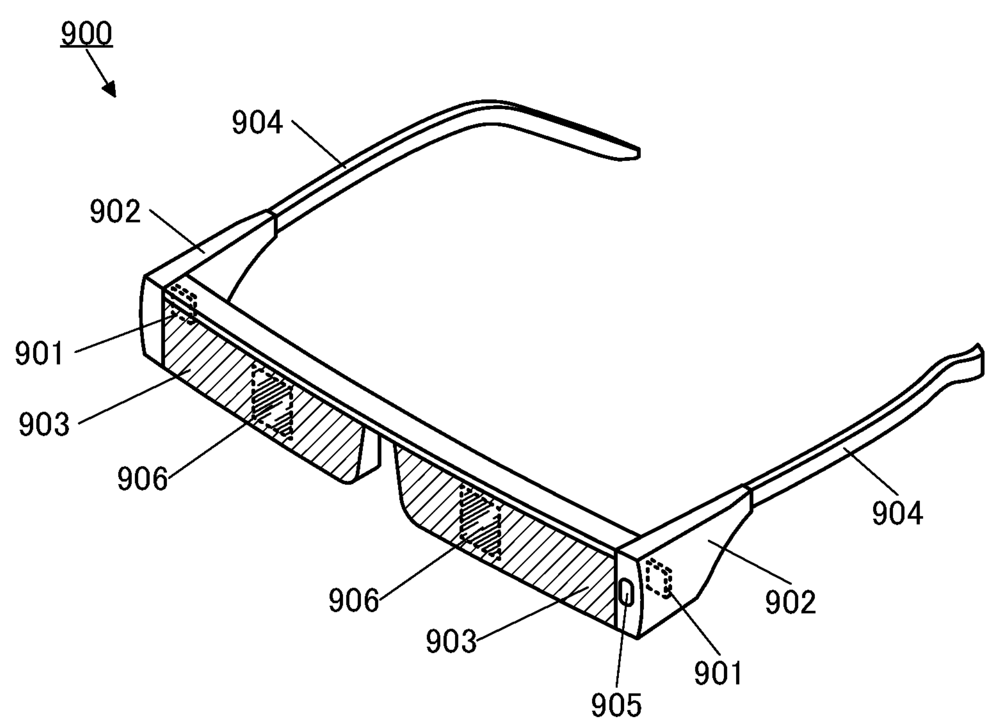
FIG. 15A and FIG. 15B are diagrams illustrating an example of an electronic device.

FIG. 15A is a perspective view of a glasses-type electronic device 900. The electronic device 900 includes a pair of display panels 901, a pair of housings 902, a pair of optical members 903, a pair of temples 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of taking an image in addition to a function of displaying an image. In that case, the electronic device 900 can receive light incident on the display panel 901 through the optical member 903, and convert the light into an electric signal to be output. Thus, an image of the user's eye or the eye and its vicinity can be taken and the image can be output to the outside or an arithmetic unit included in the electronic device 900 as image data.

One housing 902 is provided with a camera 905 capable of taking an image of what lies in front thereof. Although not illustrated, one of the housings 902 is provided with a wireless receiver or a connector to which a cable can be connected, whereby a video signal or the like can be supplied to the housing 902. Furthermore, when an acceleration sensor such as a gyroscope sensor is disposed in the housing 902, the orientation of the user's head can be detected and an image corresponding to the orientation can be displayed on the display region 906. Moreover, the housing 902 is preferably provided with a battery, and charging is preferably performed with or without a wire.

A method for projecting an image on the display region 906 of the electronic device 900 is described with reference to FIG. 15B. The display panel 901, a lens 911, and a reflective plate 912 are provided in the housing 902. In addition, a reflective surface 913 functioning as a half mirror is provided in a portion corresponding to the display region 906 of the optical member 903.

Light 915 emitted from the display panel 901 passes through the lens 911 and is reflected by the reflective plate 912 toward the optical member 903. In the optical member 903, the light 915 is fully reflected repeatedly by surfaces of an edge portion of the optical member 903 and reaches the reflective surface 913, whereby an image is projected on the reflective surface 913. Accordingly, the user can see both the light 915 reflected by the reflective surface 913 and transmitted light 916 that passes through the optical member 903 (including the reflective surface 913).

Figure 15B:
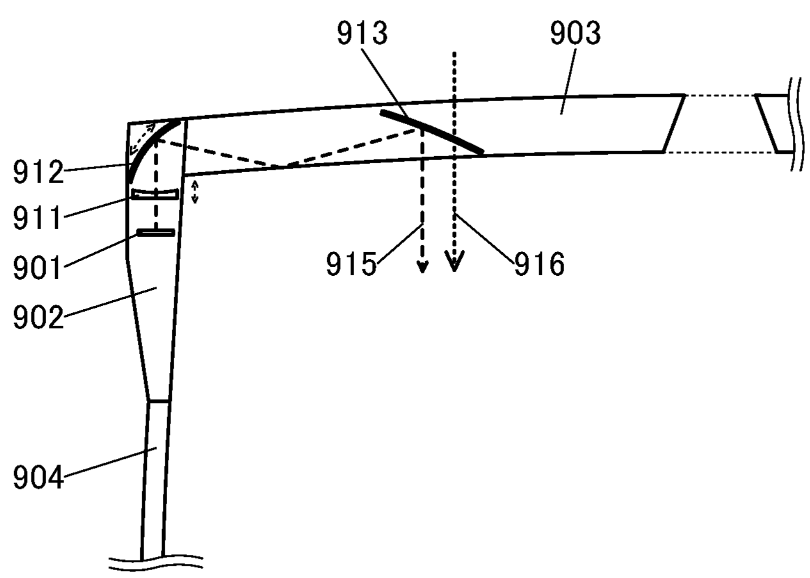

FIG. 15B shows an example in which the reflective plate 912 and the reflective surface 913 each have a curved surface. This structure can increase optical design flexibility and reduce the thickness of the optical member 903, compared to the case where the reflective plate 912 and the reflective surface 913 are flat. Note that the reflective plate 912 and the reflective surface 913 may be flat.

The reflective plate 912 can be a component having a mirror surface and preferably has high reflectivity. As the reflective surface 913, a half mirror utilizing reflection of a metal film may be used, but the use of a total-reflection prism or the like can increase the transmittance of the transmitted light 916.

Here, the electronic device 900 preferably includes a mechanism for adjusting one or both of the distance and angle between the lens 911 and the display panel 901. This enables focus adjustment, zooming in/out of an image, or the like. One or both of the lens 911 and the display panel 901 are configured to be movable in the optical-axis direction, for example.

The electronic device 900 preferably includes a mechanism capable of adjusting the angle of the reflective plate 912. The position of the display region 906 where images are displayed can be changed by changing the angle of the reflective plate 912. Thus, the display region 906 can be placed at the optimum position in accordance with the position of the user's eye.

The display apparatus of one embodiment of the present invention can be used for the display panel 901. Thus, the electronic device 900 can perform display with extremely high resolution.

Figure 16A:
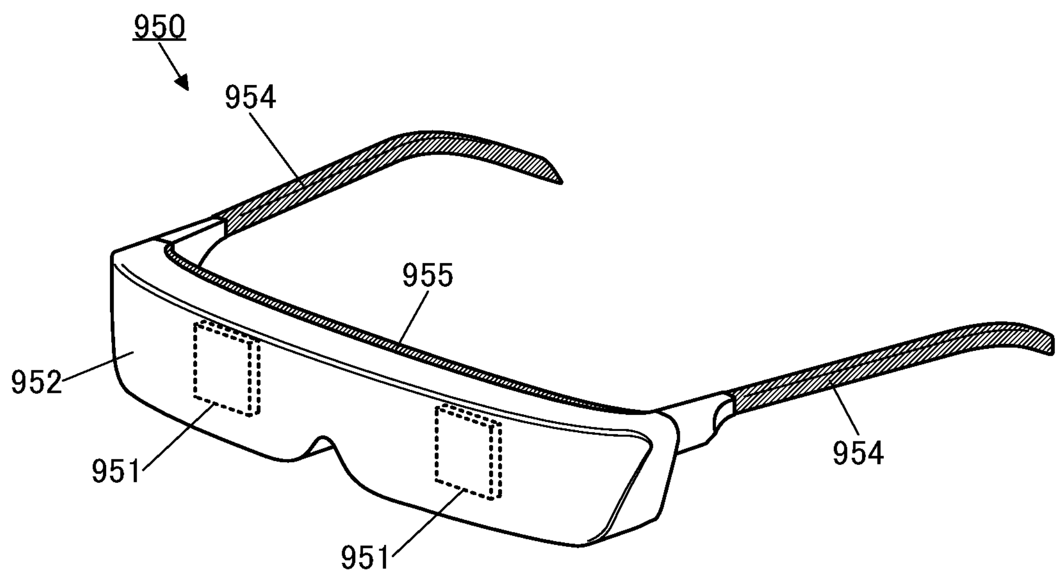
FIG. 16A and FIG. 16B are diagrams illustrating an example of an electronic device.
Figure 16B:
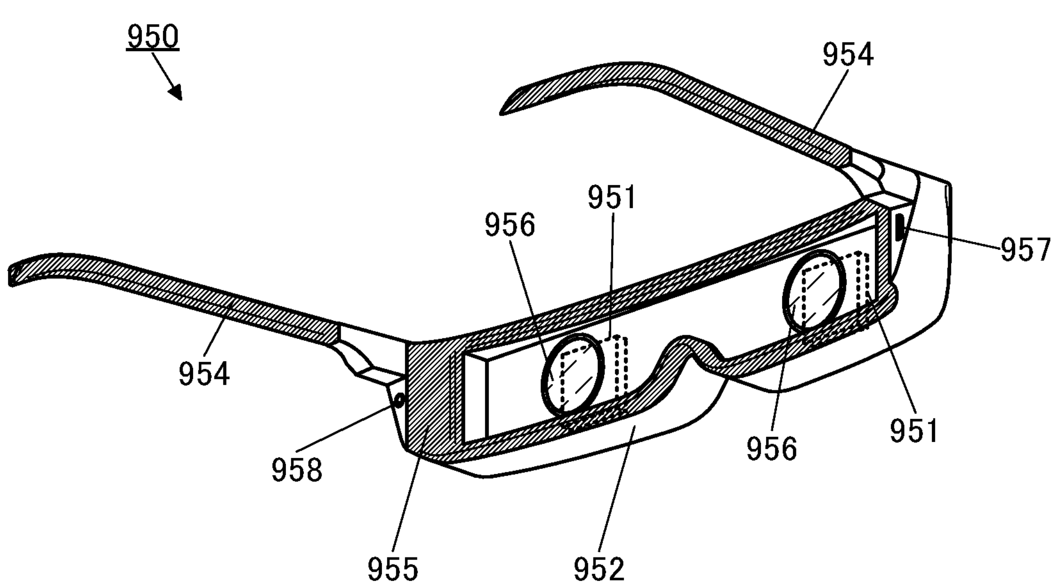

FIG. 16A and FIG. 16B are perspective views of a goggle-type electronic device 950. FIG. 16A is a perspective view illustrating the front surface, the top surface, and the left side surface of the electronic device 950, and FIG. 16B is a perspective view illustrating the back surface, the bottom surface, and the right side surface of the electronic device 950.

The electronic device 950 includes a pair of display panels 951, a housing 952, a pair of temples 954, a cushion 955, a pair of lenses 956, and the like. The pair of display panels 951 is positioned to be seen through the lenses 956 inside the housing 952.

The electronic device 950 is a VR electronic device. A user wearing the electronic device 950 can see an image displayed on the display panel 951 through the lens 956. Furthermore, the pair of display panels 951 may display different images, whereby three-dimensional display using parallax can be performed.

An input terminal 957 and an output terminal 958 are provided on the back side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

The electronic device 950 preferably includes a mechanism by which the left and right positions of the lens 956 and the display panel 951 can be adjusted to the optimum positions in accordance with the position of the user's eye. In addition, the electronic device 950 preferably includes a mechanism for adjusting the focal point by changing the distance between the lens 956 and the display panel 951.

The display apparatus of one embodiment of the present invention can be used for the display panel 951. Thus, the electronic device 950 can perform display with extremely high resolution. As a result, the user can obtain a high sense of immersion.

The cushion 955 is in contact with the user's face (forehead, cheek, or the like). The cushion 955 is in close contact with the user's face, so that light leakage can be prevented, which increases the sense of immersion. It is preferable that a soft material be used for the cushion 955 so that the cushion 955 is in close contact with the face of the user wearing the electronic device 950. For example, a material such as rubber, silicone rubber, urethane, or sponge can be used. Furthermore, when a sponge or the like whose surface is covered with cloth, leather (natural leather or synthetic leather), or the like is used as the cushion 955, a gap is less likely to be generated between the user's face and the cushion 955, whereby light leakage can be suitably prevented. The members in contact with user's skin, such as the cushion 955 and the temple 954, are each preferably detachable, in which case cleaning and replacement can be easily performed.

Figure 17A:
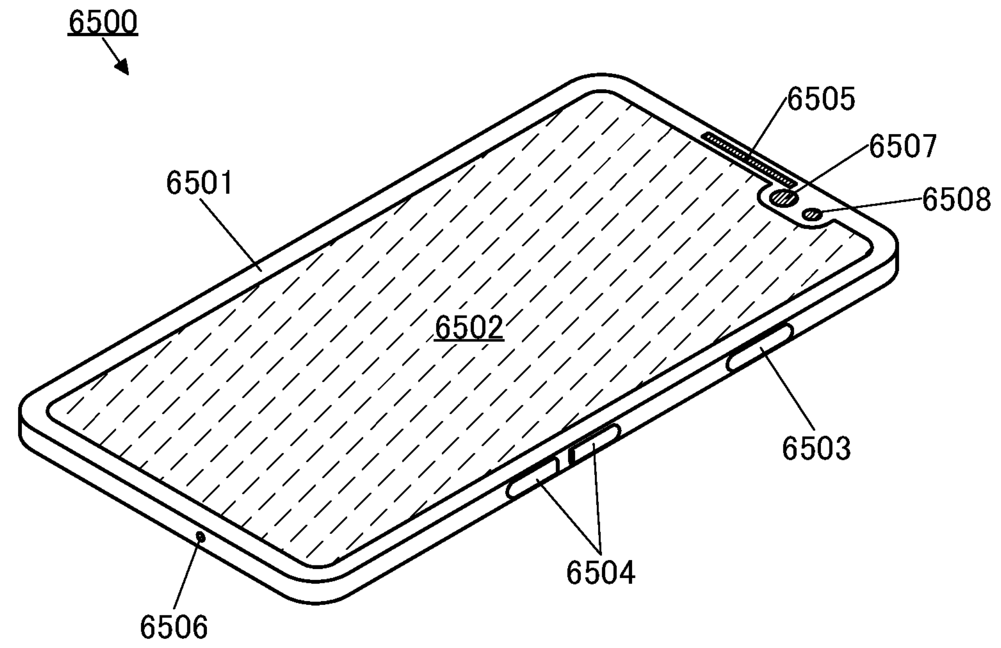
FIG. 17A and FIG. 17B are diagrams illustrating an example of an electronic device.

An electronic device 6500 illustrated in FIG. 17A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 17B:
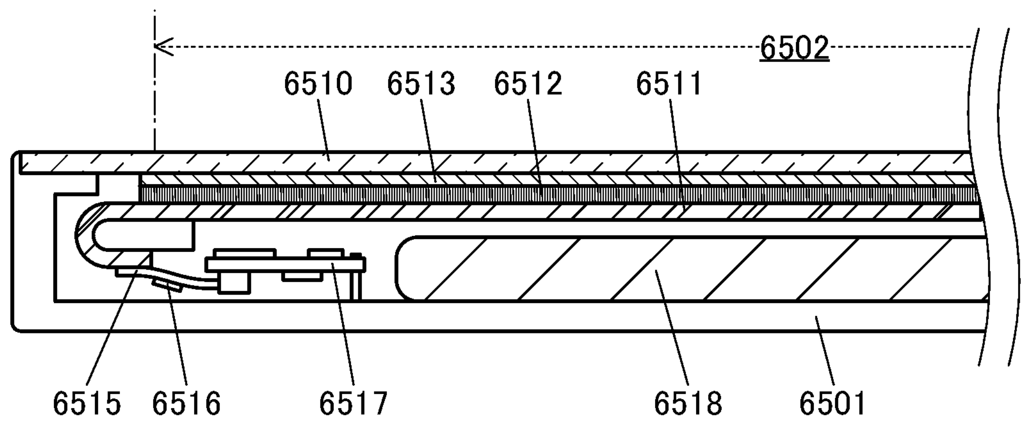

FIG. 17B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figures 18A, 18B, 18C, 18D:
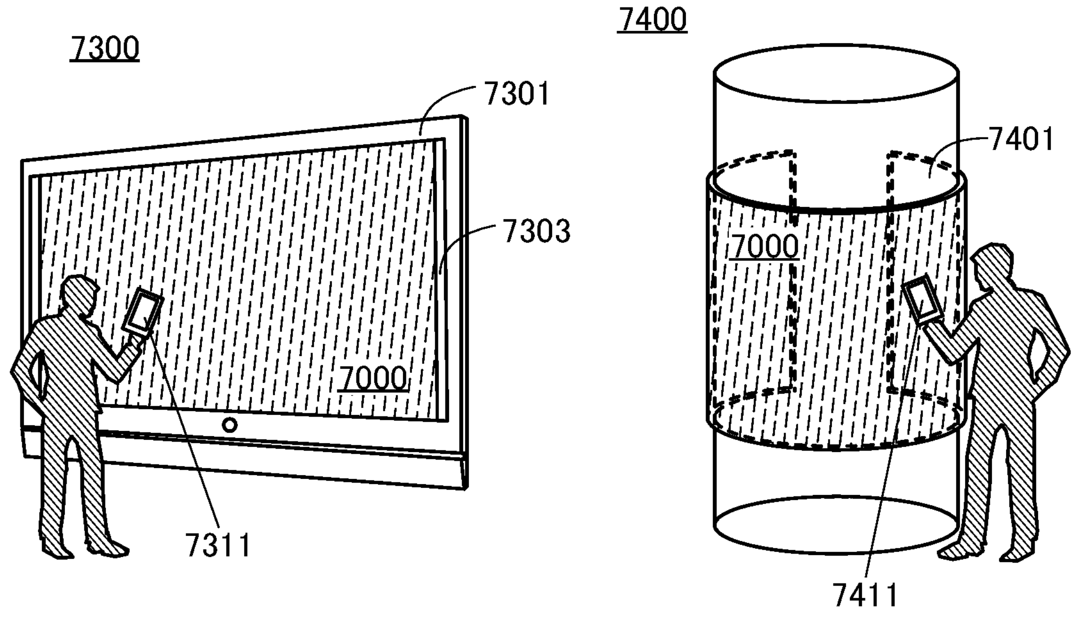
FIG. 18A to FIG. 18D are diagrams illustrating examples of electronic devices.

FIG. 18A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used in the display portion 7000.

Operation of the television device 7100 illustrated in FIG. 18A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 18B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used in the display portion 7000.

FIG. 18C and FIG. 18D show examples of digital signage.

Digital signage 7300 illustrated in FIG. 18C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 18D is digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 illustrated in each of FIG. 18C and FIG. 18D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 18C and FIG. 18D, it is preferable that the digital signage 7300 or the digital signage 7400 can work with an information terminal 7311 or an information terminal 7411 such as a smartphone that a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 19A to FIG. 19F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 19A to FIG. 19F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 19A to FIG. 19F will be described below.

FIG. 19A is a perspective view showing a portable information terminal 9101. For example, the portable information terminal 9101 can be used as a smartphone. Note that the portable information terminal 9101 may be provided with the speaker 9003, the connection terminal 9006, the sensor 9007, and the like. The portable information terminal 9101 can display characters or image information on its plurality of surfaces. FIG. 19A illustrates an example in which three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed in the position where the information 9051 is displayed.

FIG. 19B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 19C is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 19D to FIG. 19F are perspective views showing a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with any of the other embodiments as appropriate.

REFERENCE NUMERALS

11: layer, 12: layer, 13: layer, 14: layer, 15: layer, 16: layer, 17: layer, 20B: pixel, 20G: pixel, 20R: pixel, 100A: display apparatus, 100B: display apparatus, 100C: display apparatus, 100D: display apparatus, 100E: display apparatus, 100F: display apparatus, 102: insulating layer, 103: insulating layer, 104: insulating layer, 110: light-emitting diode, 110B: light-emitting diode, 110G: light-emitting diode, 110R: light-emitting diode, 113: semiconductor layer, 113*a*: semiconductor layer, 114: light-emitting layer, 114*a*: light-emitting layer, 114*b*: light-emitting layer, 115: semiconductor layer, 115*a*: semiconductor layer, 115*b*: semiconductor layer, 120: transistor, 120*c*: transistor, 120*e*: transistor, 130: transistor, 130*d*: transistor, 130*e*: transistor, 130*f*: transistor, 130*g*: transistor, 132: element isolation layer, 133: low-resistance region, 134: insulating layer, 135: conductive layer, 136: insulating layer, 137: conductive layer, 138: conductive layer, 139: insulating layer, 141: insulating layer, 142: insulating layer, 143: insulating layer, 151: substrate, 152: substrate, 153: silicon substrate, 154: substrate, 161: conductive layer, 162: insulating layer, 163: insulating layer, 164: insulating layer, 165: metal oxide layer, 166: conductive layer, 167: insulating layer, 168: conductive layer, 171: substrate, 173: insulating layer, 174: conductive layer, 175: conductive layer, 176: conductor, 177: conductive layer, 178: conductive layer, 179: adhesive layer, 181: insulating layer, 182: insulating layer, 183: insulating layer, 184*a*: conductive layer, 184*b*: conductive layer, 185: insulating layer, 186: insulating layer, 187: insulating layer, 188: insulating layer, 189: conductive layer, 190*a*: conductive layer, 190*b*: conductive layer, 190*c*: conductive layer, 191*a*: conductive layer, 191*b*: conductive layer, 191*c*: conductive layer, 192: conductive layer, 193: reflective layer, 194: conductive layer, 195: conductive layer, 196: conductive layer, 197: conductor, 200: transistor, 205: conductor, 205*a*: conductor, 205*b*: conductor, 212: insulator, 214: insulator, 216: insulator, 222: insulator, 224: insulator, 230: oxide, 230*a*: oxide, 230*b*: oxide, 240: conductor, 240*a*: conductor, 240*b*: conductor, 241: insulator, 241*a*: insulator, 241*b*: insulator, 242: conductor, 242*a*: conductor, 242*b*: conductor, 243: oxide, 243*a*: oxide, 243*b*: oxide, 246: conductor, 246*a*: conductor, 246*b*: conductor, 250: insulator, 250*a*: insulator, 250*b*: insulator, 260: conductor, 260*a*: conductor, 260*b*: conductor, 271: insulator, 271*a*: insulator, 271*b*: insulator, 275: insulator, 280: insulator, 282: insulator, 283: insulator, 285: insulator, 300: substrate, 310: separation layer, 320: adhesive layer, 330: substrate, 350: light-blocking layer, 351: light-blocking layer, 360B: color conversion layer, 360G: color conversion layer, 360R: color conversion layer, 361B: coloring layer, 361G: coloring layer, 361R: coloring layer, 401: pixel portion, 402: region, 500: adhesive layer, 501: FPC, 502: FPC, 700: electronic device, 701: display panel, 702: housing, 703: optical member, 704: temple, 706: display region, 707: frame, 708: nose pad, 712: reflective plate, 713: reflective surface, 715: light, 716: transmitted light, 717: battery, 718: wireless power supply module, 719: touch sensor module, 720: finger, 900: electronic device, 901: display panel, 902: housing, 903: optical member, 904: temple, 905: camera, 906: display region, 911: lens, 912: reflective plate, 913: reflective surface, 915: light, 916: transmitted light, 950: electronic device, 951: display panel, 952: housing, 954: temple, 955: cushion, 956: lens, 957: input terminal, 958: output terminal, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal.

The invention claimed is:

1. A display apparatus comprising:

a first layer;

a second layer;

a third layer; and a fourth layer, wherein the second layer and the third layer are provided between the first layer and the fourth layer, wherein the second layer is provided between the first layer and the third layer, wherein the first layer comprises a first transistor, wherein the second layer comprises a second transistor, wherein the third layer comprises a reflective layer, wherein the fourth layer comprises a light-emitting diode, wherein the first transistor, the second transistor, the reflective layer, and the light-emitting diode comprise an overlap region, wherein a first insulating layer is provided between the first transistor and the second transistor, wherein a second insulating layer is provided between the second transistor and the reflective layer, wherein a third insulating layer is provided between the reflective layer and the light-emitting diode, wherein the light-emitting diode comprises a semiconductor layer, and wherein the semiconductor layer comprises a region in contact with the third insulating layer.

2. The display apparatus according to claim 1, further comprising a fifth layer, wherein the fifth layer is provided so that the fourth layer is positioned between the fifth layer and the third layer, wherein the fifth layer comprises one or both of a color conversion layer and a coloring layer, wherein one or both of the color conversion layer and the coloring layer, the first transistor, the second transistor, the reflective layer, and the light-emitting diode comprise an overlap region, and wherein a fourth insulating layer is provided between the light-emitting diode and one or both of the color conversion layer and the coloring layer.

3. The display apparatus according to claim 2, wherein the color conversion layer comprises a phosphor or a quantum dot.

4. The display apparatus according to claim 1, wherein the first transistor comprises silicon in a channel formation region.

5. The display apparatus according to claim 1, wherein the second transistor comprises a metal oxide in a channel formation region, and wherein the metal oxide comprises In, Zn, and M (M is one or more of Al, Ti, Ga, Ge, Sn, Y, Zr, La, Ce, Nd, and Hf).

6. The display apparatus according to claim 1, wherein the first transistor is a component of a circuit for driving a pixel circuit, and wherein the second transistor is a component of the pixel circuit.

7. The display apparatus according to claim 1, wherein the semiconductor layer comprises a compound semiconductor comprising a Group 13 element and a Group 15 element.

8. The display apparatus according to claim 1, wherein the light-emitting diode emits blue light, bluish violet light, violet light, or ultraviolet light.

9. An electronic device comprising:

the display apparatus according to claim 1; and one or more of a battery, a housing, a camera, a speaker, and a microphone.

10. The display apparatus according to claim 1, wherein a conductive layer is in contact with a top surface of the semiconductor layer, and wherein the conductive layer is electrically connected to one of a source and a drain of the second transistor.

11. A display apparatus comprising:

a first transistor;

a first insulating layer over the first transistor;

a second transistor over the first insulating layer;

a second insulating layer over the second transistor;

a reflective layer over the second insulating layer;

a third insulating layer over the reflective layer; and a light-emitting diode over the third insulating layer, wherein the light-emitting diode comprises a semiconductor layer which is in contact with the third insulating layer.

* * * * *